(12) United States Patent
Kasuya et al.

(10) Patent No.: US 9,837,243 B2
(45) Date of Patent: Dec. 5, 2017

(54) ION PUMP AND CHARGED PARTICLE BEAM DEVICE USING THE SAME

(71) Applicant: HITACHI, LTD., Chiyoda-ku, Tokyo (JP)

(72) Inventors: Keigo Kasuya, Tokyo (JP); Takeshi Kawasaki, Tokyo (JP); Takashi Ohshima, Tokyo (JP); Souichi Katagiri, Tokyo (JP)

(73) Assignee: HITACHI, LTD., Tokyo (JP)

( * ) Notice: Subject to any disclaimer, the term of this patent is extended or adjusted under 35 U.S.C. 154(b) by 3 days.

(21) Appl. No.: 15/015,930

(22) Filed: Feb. 4, 2016

(65) Prior Publication Data
US 2016/0233050 A1    Aug. 11, 2016

(30) Foreign Application Priority Data
Feb. 6, 2015    (JP) .................................. 2015-022126

(51) Int. Cl.
*H01J 41/20*    (2006.01)
*H01J 37/18*    (2006.01)

(52) U.S. Cl.
CPC .............. *H01J 37/18* (2013.01); *H01J 41/20* (2013.01); *H01J 2237/1825* (2013.01)

(58) Field of Classification Search
CPC .. H01J 41/20; H01J 7/183; H01J 37/18; H01J 2237/1825
See application file for complete search history.

(56) References Cited

U.S. PATENT DOCUMENTS

| 3,827,829 A * | 8/1974 | Tom ...................... H01J 41/20 |
|---|---|---|
| | | 417/49 |
| 2009/0134018 A1 * | 5/2009 | Watanabe ............. C23C 14/564 |
| | | 204/298.03 |
| 2011/0089336 A1 * | 4/2011 | Kasuya ................. H01J 37/073 |
| | | 250/424 |
| 2014/0369856 A1 * | 12/2014 | Bonucci .................. H01J 41/20 |
| | | 417/48 |

FOREIGN PATENT DOCUMENTS

| JP | 4-65057 A | 3/1992 |
|---|---|---|
| JP | 4-154036 A | 5/1992 |
| JP | 2001-357814 A | 12/2001 |

OTHER PUBLICATIONS

Office Action dated Oct. 27, 2015, in Japanese Patent Application No. 2015-022126.

\* cited by examiner

*Primary Examiner* — Wyatt Stoffa
*Assistant Examiner* — Eliza Osenbaugh-Stewart
(74) *Attorney, Agent, or Firm* — Miles & Stockbridge P.C.

(57) ABSTRACT

An ion pump and a charged particle beam device each includes two opposite flat-plate cathodes, an anode with a cylindrical shape having openings that face the respective flat-plate cathodes, a voltage application unit configured to apply a potential higher than potentials of the flat-plate cathodes to the anode, a magnetic field application unit configured to apply a magnetic field along an axial direction of the cylindrical shape of the anode, and a cathode bar arranged within the anode. The surface of the cathode bar is formed with a material that forms a non-evaporative getter alloy film on the anode or the flat-plate cathodes.

13 Claims, 19 Drawing Sheets

ION PUMP AND CHARGED PARTICLE BEAM DEVICE USING THE SAME

CLAIM OF PRIORITY

The present application claims priority from Japanese patent application JP 2015-022126 filed on Feb. 6, 2015, the content of which is hereby incorporated by reference into this application.

BACKGROUND

Technical Field

The present invention relates to an ion pump and a charged particle beam device using the same.

Background Art

Ion pumps are widely used as means for evacuating a device that requires a high degree of vacuum (i.e., a low pressure), such as an electron gun of a charged particle beam device (i.e., an electron microscope), to a vacuum. An ion pump can discharge not only common gas in the air, such as nitrogen, water, oxygen, carbon oxide, and hydrogen, but also noble gas such as argon and inert gas such as methane, and can obtain an extreme high vacuum of up to $10^{-8}$ Pa even when the ion pump is used alone. However, an ion pump has a characteristic that its hydrogen pumping speed decreases with decreasing pressure. As the major constituent of the residual gas in an extreme high vacuum range of less than or equal to $10^{-9}$ Pa is hydrogen, it is impossible to obtain an extreme high vacuum when an ion pump is used alone.

In recent years, a non-evaporative getter (hereinafter referred to as "NEG") pump has been used to obtain an extreme high vacuum. A NEG pump is formed using a NEG alloy that is obtained by mixing a plurality of metals together. A NEG alloy is chemically active and has a high hydrogen pumping speed, but has a characteristic that it cannot discharge noble gas or inert gas. Thus, when a device is evacuated by using an ion pump and a NEG pump together, the drawbacks of the two pumps are compensated with each other, and an extreme high vacuum of less than or equal to $10^{-9}$ Pa can thus be obtained.

However, when the two pumps are mounted on a device, the device becomes complex and large, and also becomes expensive. Further, as the NEG pump is a pump that utilizes surface adsorption, it is necessary to periodically perform activation by heating the pump to a high temperature to maintain the pumping ability. Therefore, the maintainability of the device decreases.

Patent Document 1 below discloses an ion pump that continuously forms a NEG alloy on the surface of an anode by embedding the constituents of the NEG alloy in a flat-plate cathode of the ion pump and sputtering them. In particular, Patent Document 1 describes adjusting the weight ratio between zirconium and aluminum on the plane of the cathode 11, the sputtered area ratio, the sputtering rate, and a distribution of the ion density in accordance with the intended use, and consequently, $10^{-11}$ Pa can be obtained when the ion pump is used alone.

RELATED ART DOCUMENTS

Patent Documents

Patent Document 1: JP Patent Publication (Kokai) 2001-357814 A

SUMMARY

Thus, for an ion pump, it is generally known that a sputtered portion of the surface of a cathode changes (i.e., the sputtered area decreases) with changing pressure. That is, in an ultra-high vacuum or an extreme high vacuum, a phenomenon may occur in which a sputtered portion is locally concentrated at a point on the flat-plate cathode corresponding to the central axis of a cylindrical anode cell. Therefore, in the configuration of Patent Document 1, as the sputtered region decreases, it becomes difficult to sputter a plurality of NEG constituents in desired quantities, and thus form an NEG alloy with the intended composition ratio. Consequently, the pumping speed decreases, and it takes a longer time to attain a target pressure, which is problematic in that a further increase in the degree of vacuum is difficult to achieve.

The present invention has been made in view of the foregoing problems. It is an object of the present invention to provide an ion pump that can prevent a sputtered portion from being localized, maintain a high pumping speed even under a low pressure, reduce the pumping time, and increase the degree of vacuum.

An ion pump of the present invention includes two opposite flat-plate cathodes; an anode with a cylindrical shape having openings, the openings facing the respective flat-plate cathodes; a voltage application unit configured to apply a potential higher than potentials of the flat-plate cathodes to the anode; a magnetic field application unit configured to apply a magnetic field along an axial direction of the cylindrical shape of the anode; and a cathode bar arranged within the anode. A surface of the cathode bar is formed with a material that forms a non-evaporative getter alloy film on the anode or the flat-plate cathodes. In addition, a charged particle beam device of the present invention includes a column that houses irradiation optics to irradiate a sample with a charged particle beam; a sample chamber in which the sample is set; and an ion pump connected to one of the column or the sample chamber. The ion pump includes two opposite flat-plate cathodes, an anode with a cylindrical shape having openings, the openings facing the respective flat-plate cathodes, a voltage application unit configured to apply a potential higher than potentials of the flat-plate cathodes to the anode, a magnetic field application unit configured to apply a magnetic field along an axial direction of the cylindrical shape of the anode, and a cathode bar arranged within the anode. A surface of the cathode bar is formed with a material that forms a non-evaporative getter alloy film on the anode or the flat-plate cathodes.

According to the present invention, it is possible to prevent a sputtered portion from being localized and maintain a high pumping speed.

Other problems, configurations, and advantageous effects will become apparent from the following description of embodiments.

DETAILED DESCRIPTION OF THE EMBODIMENT(S)

Embodiment 1

Figure 1:
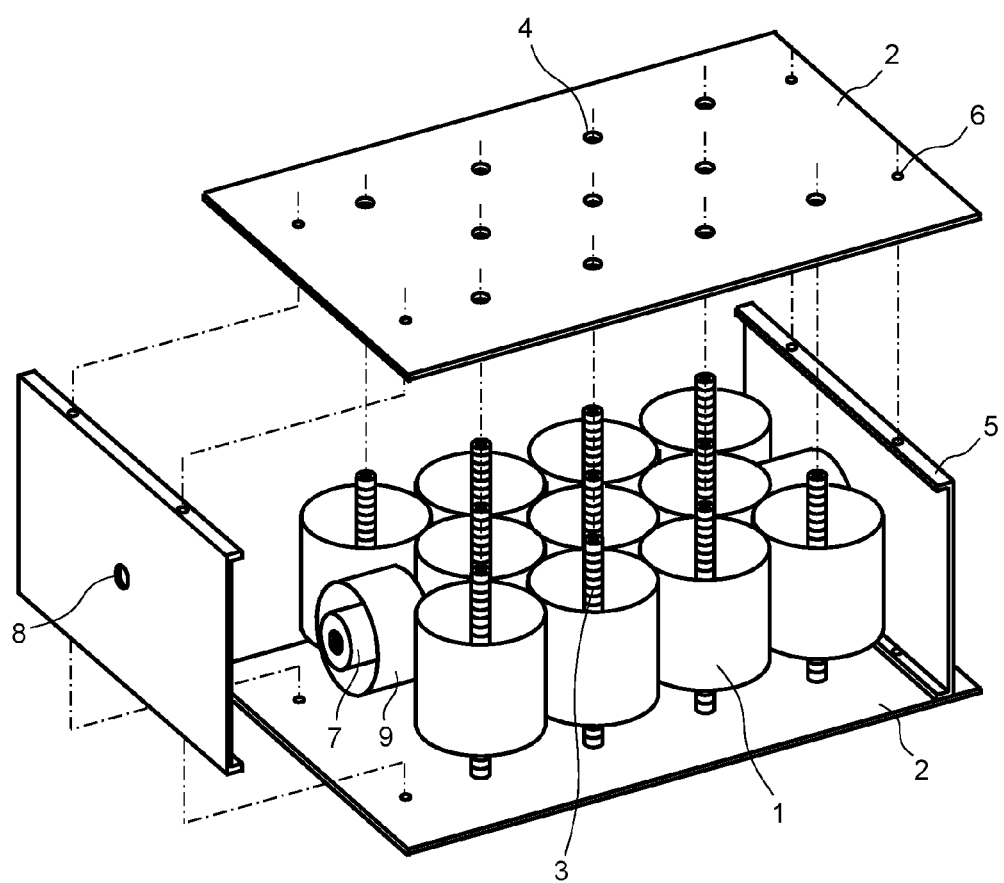
FIG. 1 is a perspective view showing elements of an ion pump in accordance with the present invention.

FIG. 1 is a perspective view showing elements of an ion pump in accordance with the present invention. The dashed-dotted line shows the mounting position of each component during assembly. The ion pump elements in FIG. 1 include an anode 1 having a plurality of cylindrical cells, two flat-plate cathodes 2 that are arranged along a direction in which openings of the anode 1 face, so as to sandwich the anode 1 therebetween, and cathode bars 3 that are arranged coaxially with the respective cylindrical cells. The flat-plate cathodes 2 and the cathode bars 3 are fixed together with bolts (not shown) screwed into fastening holes 4. Between the two flat-plate cathodes 2 are provided side walls 5 that are fixed thereto with bolts screwed into fastening holes 6.

The anode 1 has a configuration in which a plurality of cylindrical cells is welded and arranged. In order to arrange as many cylindrical cells as possible within the limited volume of the pump and increase the pumping speed, it is effective to arrange the cylindrical cells alternately. A side face of the anode 1 is provided with an insulator 7 for electrically insulation. The insulator 7 and the side wall 5 are fixed together with a bolt screwed into a fastening hole 8. Consequently, the anode 1 is arranged at a distance from the flat-plate cathodes 2, and thus is electrically insulated. Meanwhile, the flat-plate cathodes 2 and the cathode bars 3 are electrically connected. A region around the insulator 7 is provided with a shield 9 so as to prevent a sputtered film from depositing on the insulator 7, which would otherwise allow electrical conduction. As exemplary materials of the components, titanium is used for the flat-plate cathodes, stainless steel is used for the anode 1, the side walls 5, and the shields 9, and alumina is used for the insulator 7.

Figure 2:
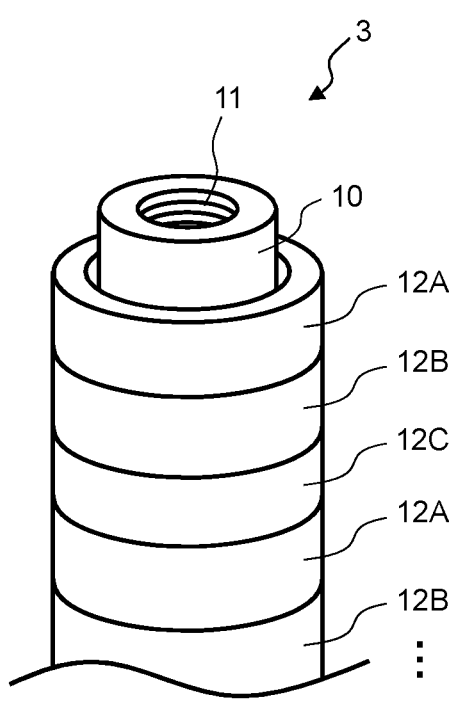
FIG. 2 is a perspective view showing the details of a cathode bar 3.

FIG. 2 is a perspective view showing the details of each cathode bar 3. The cathode bar 3 includes a support bar 10 and a plurality of NEG constituents 12.

The opposite ends of the support bar are provided with tapped holes 11, for example, which are screwed into the fastening holes 4 of the flat-plate cathodes 2. As the material of the support bar 10, stainless steel is used, for example. The support bar 10 is a rigid body. Fixing the support bar 10 to the flat-plate cathodes 2 can precisely arrange the cathode bar 3 at the center of the cylindrical cell. Further, shakes due to external vibrations can be reduced. Consequently, it is possible to reduce failures, such as abnormal electric discharge, and form a sputtered film with a uniform composition and thickness independently of the place. Consequently, normal, stable performance can be realized even when the ion pump of the present invention is mounted on a device to be evacuated and is operated for a long period of time, for example, for several months to several years. It should be noted that the support bar 10 may be omitted if the aforementioned performance is be realized only with the NEG constituents 12.

The NEG constituents 12 are formed by stacking a plurality of cylindrical structures made of different metals and the like. The NEG constituents 12 are arranged around the outer periphery of the support bar 10 as the center. Exemplary materials of the NEG constituents 12 include zirconium 12A, vanadium 12B, and iron 12C. Such metals are sequentially stacked, for example, along the drawing direction of the support bar 10 to form a structural unit, and such structural units are further repeatedly stacked. Thus, the surface of the cathode bar 3 is covered with such repeatedly stacked structural units.

For the ion pump of the present invention, it is also possible to use an NEG alloy itself as the support bar 10 without using the NEG constituents 12. In such a case also, uniform, desired NEG alloy films 29 can be generated, and similar advantageous effects can be exerted. However, NEG alloys are typically brittle materials, and some types of NEG alloys may even ignite spontaneously in air. Therefore, the types of NEG alloys that can be used as the support bar 10 through processing and assembly are limited. Meanwhile, if metals and the like that are not a NEG alloy itself but are the constituents of a NEG alloy are independently used as in the present invention, there is no possibility that such metals will undergo brittle fracture or ignite spontaneously. Thus, such metals and the like can be handled safely. When such metals and the like are arranged in each cylindrical cell 23 and are alloyed in a vacuum in the device, there is an advantage in that the desired NEG alloy can be used safely. Further, even a NEG alloy that has been conventionally difficult to be molded and has had a limited use as it may ignite spontaneously can be used safely according to the method of the present invention. Thus, the range of use of the NEG alloy can be expanded.

Figure 3:
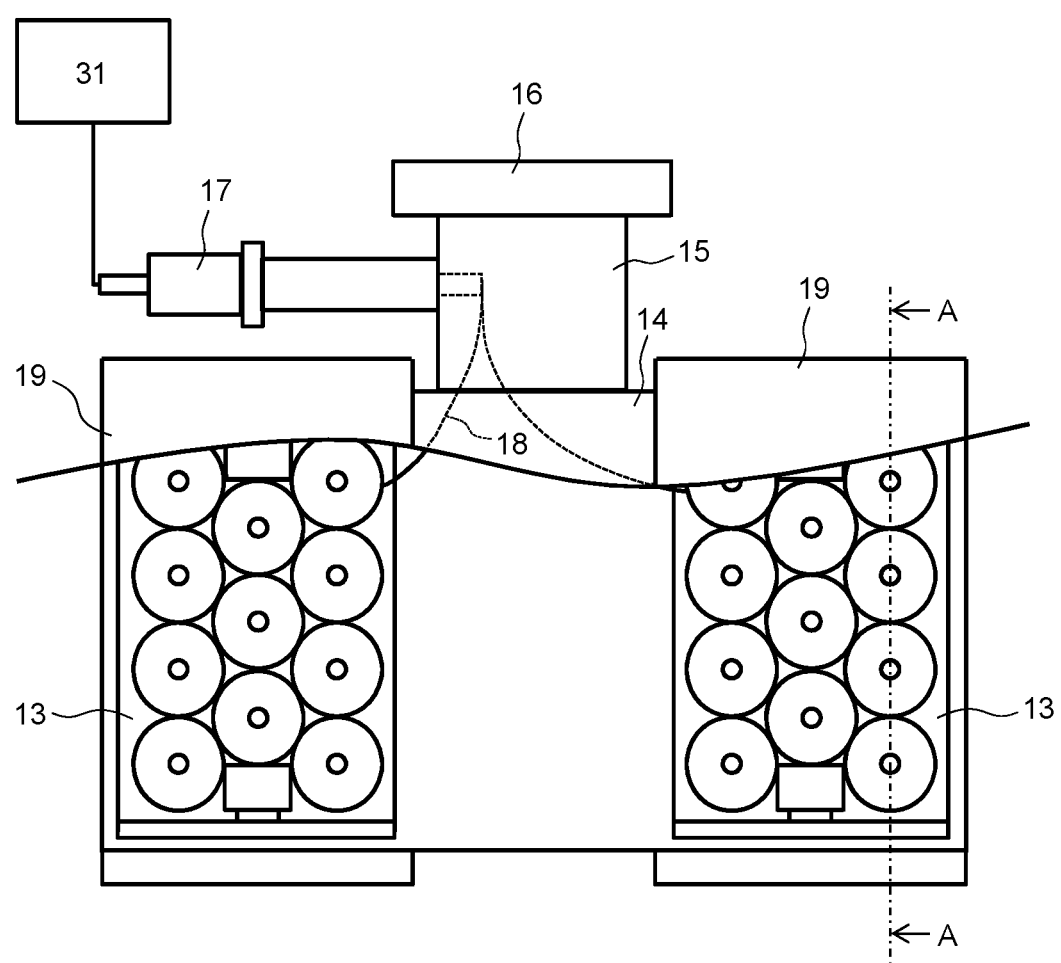
FIG. 3 is a partially broken plan view of the ion pump.

FIG. 3 is a partially broken plan view of the ion pump. Ion pump elements 13 shown in FIG. 1 are arranged in a container 14. The container 14 has a pipe 15 and a flange 16 attached thereto. The flange 16 is connected to a device to be evacuated so as to evacuate the device to a vacuum. The pipe 15 is provided with a feed-through 17. An external voltage application unit (i.e., a voltage source 31) is connected to the feed-through 17, and a voltage is applied to the anodes 1 of the ion pump elements 13 via wires 18 to set the potentials of the anodes 1 to be higher than those of the flat-plate cathodes 2. The container 14 has a magnetic field application unit 19 (i.e., magnets 20 and yokes 21 described below) attached thereto so that a magnetic field is applied to the ion pump elements 13. The magnetic field application unit 19 is configured to be removable so that it is removed as appropriate when the ion pump is baked at a high temperature, for example. The container 14 is formed using a non-magnetic material. For example, stainless steel is used.

Figure 4:
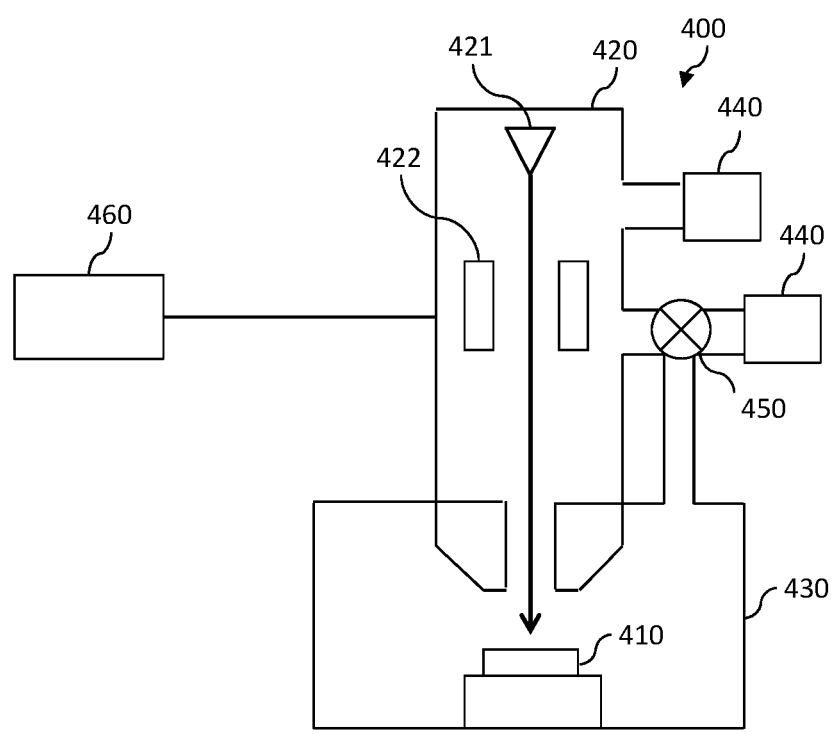
FIG. 4 is a side view showing the configuration of a charged particle beam device 400 with an ion pump 440 in accordance with the present invention.

FIG. 4 is a side view showing the configuration of a charged particle beam device 400 with an ion pump 440 in accordance with the present invention. The charged particle beam device 400 is a device for irradiating a sample 410 arranged in a sample chamber 430 with a charged particle beam. A charged particle beam emitted from a charged particle beam source 421 is deflected and focused by irradiation optics 422, and is allowed to become incident on the sample 410. A column 420 houses the charged particle beam source 421 and the irradiation optics 422. The ion pump 440 is the ion pump in accordance with the present invention, and is connected to at least one of the column 420 or the sample chamber 430 so as to evacuate the inside thereof. The ion pump 440 may have a valve 450. A controller 460 controls the entire operation of the charged particle beam device 400, and acquires an observed image of the sample 410, for example.

Figure 5:
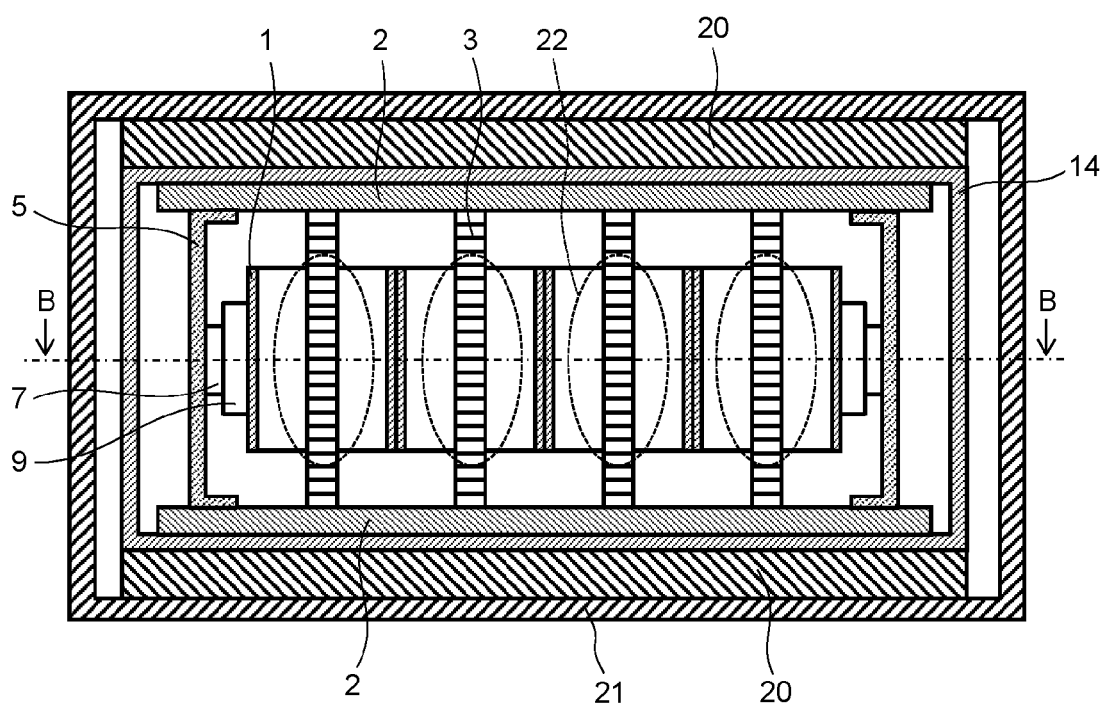
FIG. 5 is a sectional view along A-A of FIG. 3 (i.e., a side sectional view of the ion pump).

FIG. 5 is a sectional view along A-A of FIG. 3 (i.e., a side sectional view of the ion pump). Magnets 20 are arranged outside the container 14 so that a magnetic field is applied in the drawing direction of each cathode bar 3. The magnets 20 are preferably placed outside the container 14 so that they can be removed during baking. However, the magnets 20 may also be placed in the container 14 as long as equal advantageous effects are exerted. Next, the yokes 21 are provided so as to be in contact with the magnets 20. Then, even when the applied magnetic field is increased, it is possible to prevent the magnetic field from leaking out of the ion pump. The applied magnetic field is typically from 0.01 T to 0.3 T. The container 14 is grounded, and a voltage of typically +0.1 kV to +7 kV is applied to the anode 1. When such a voltage is applied in a vacuum, an electron cloud 22 is formed between each cylindrical cell of the anode 1 and the cathode bar 3. By the electron cloud 22, generation of NEG alloys and vacuum evacuation are carried out.

Figure 6A:
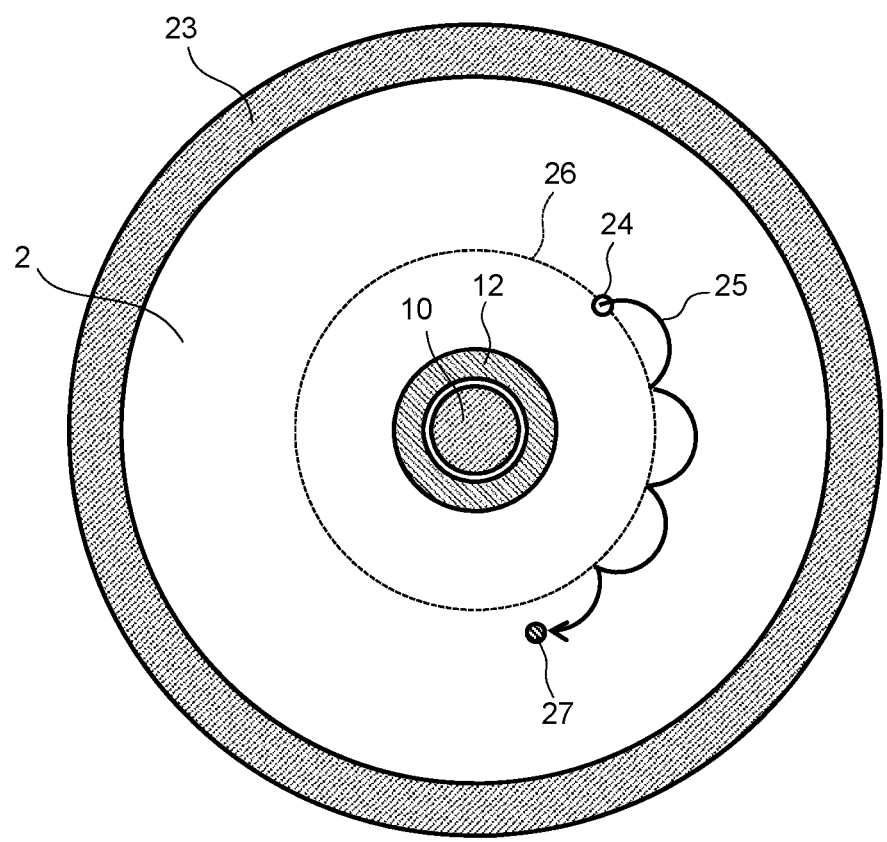
FIG. 6A is a view illustrating the initial process of the ion pump operation.
Figure 6B:
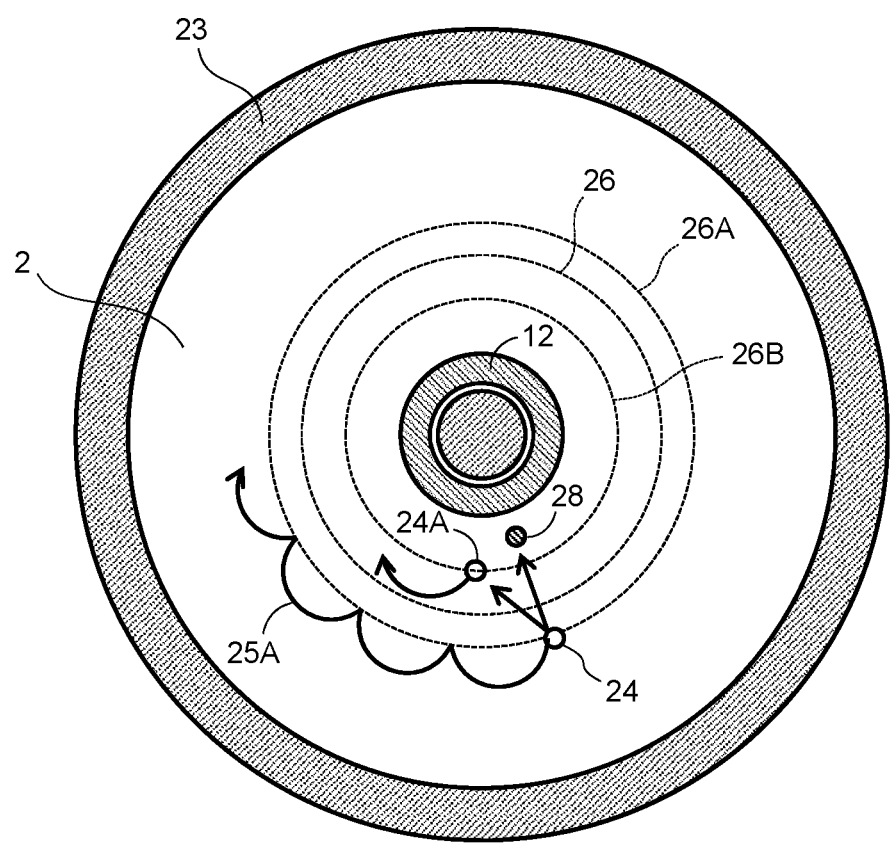
FIG. 6B is a view illustrating the intermediate process of the ion pump operation.
Figure 6C:
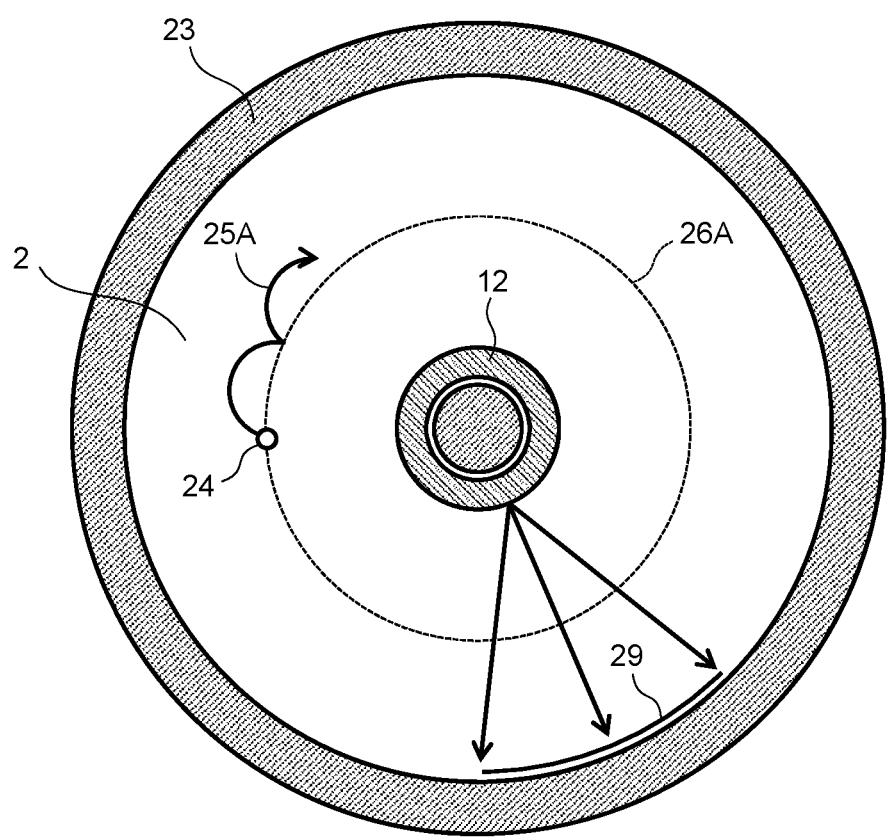
FIG. 6C is a view illustrating the last process of the ion pump operation.

FIGS. 6A to 6C are sectional views along B-B of FIG. 5 (i.e., plan views of the ion pump). Herein, plan views of a single cylindrical cell that forms the cylinder portion of the anode 1 are shown. The operation principle of the ion pump in accordance with the present invention will be sequentially described with reference to FIGS. 6A to 6C.

FIG. 6A is a view illustrating the initial process of the ion pump operation. First, the inside of the ion pump is roughly evacuated to about $10^{-2}$ Pa using a rotary pump, a turbomolecular pump, and the like (not shown). The cathode bar 3 including the support bar 10 and the NEG constituents 12 is arranged along the central axis of the cylindrical cell 23.

When a voltage higher than that of the cathode bar 3 is applied to the cylindrical cell 23, an electric field is generated from the inner wall of the cylindrical cell 23 toward the NEG constituents 12. An electron 24 within the cylindrical cell 23 is accelerated toward the cylindrical cell 23 by the electric field. At this time, as a magnetic field is applied to the cylindrical cell 23 in the axial direction thereof, the Lorentz force acts on the electron 24, thus bending the traveling direction. Consequently, the electron 24 keeps on moving along a trochoidal trajectory, and thus is trapped inside without easily reaching the cylindrical cell 23. The electron 24 does not have an energy higher than its potential energy as the potential energy at the initial position is converted into the kinetic energy. Therefore, the electron 24 does not move to the center side than the equipotential surface 26. The electron 24 that continues its trochoidal motion eventually collides with the residual gas 27 in the vacuum, thus ionizing the gas.

FIG. 6B is a view illustrating the intermediate process of the ion pump operation. The electron 24 that has collided with the residual gas 27 loses its energy upon collision, and continues its motion along a trochoidal trajectory 25A having another equipotential surface 26A. Meanwhile, as the residual gas 27 in FIG. 6A was ionized, a new electron 24A is emitted. The initial energy of the electron 24A is as low as several eV, and this electron also undergoes trochoidal motion that also has an equipotential surface 26B. The electron 24 and the electron 24A eventually collide with the new residual gas, so that ionization and electron emission occur. Through repetition of such electron emission, electrons in the cylindrical cell 23 are increased in an avalanche manner. Electric discharge is generated in the cylindrical cell 23, and an electron cloud 22 is formed. Meanwhile, an ion 28 of the residual gas is accelerated in the electric field, and collides with the NEG constituents 12 and the flat-plate cathode 2.

FIG. 6C is a view illustrating the last process of the ion pump operation. Many of ions in the residual gas collide with the nearest NEG constituents 12, thus sputtering the NEG constituents 12. Consequently, the elements of the NEG constituents 12 are radially emitted and deposit on the inner wall of the cylindrical cell 23 and the surfaces of the flat-plate cathodes 2. As described with reference to FIG. 2, the NEG constituents 12 are formed of a plurality of independent metals and the like, and are arranged by sequentially stacking zirconium 12A, vanadium 12B, and iron 12C, for example, in the depth direction of FIG. 6C. When such metals are deposited and mixed together, zirconium-vanadium-iron NEG alloy films 29 are generated. It should be noted that as the materials of the NEG constituents 12, a variety of materials, such as alloys or ceramics, can also be used. However, such materials will be collectively represented as metals and the like (or materials) for the sake of simplification, and the materials of the NEG constituents 12 are thus not limited to so-called pure metals.

Figure 7:
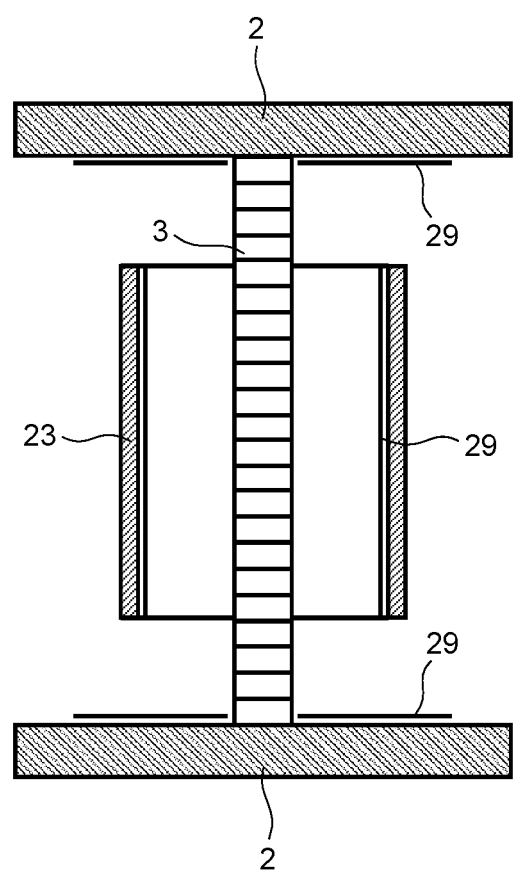
FIG. 7 is a side sectional view showing portions in which NEG alloy films 29 are generated.

FIG. 7 is a side sectional view showing portions in which the NEG alloy films 29 are generated. As the cathode bar 3 is sputtered by ions of the residual gas, the NEG alloy films 29 are generated on the inner wall of the cylindrical cell 23 and the surfaces of the flat-plate cathodes 2. Such NEG alloy films 29 mainly serve in the role of vacuum evacuation.

The NEG alloy films 29 have a high adsorption coefficients with respect to hydrogen, nitrogen, water, oxygen, carbon oxide, and the like. Consequently, the residual gas that has been adsorbed onto the NEG alloy films 29 sticks to their surfaces as is, and thus is discharged. Typically, inert gas such as methane cannot be adsorbed onto NEG alloys.

However, in the ion pump of the present invention, molecular bonds of gas are broken through electron collision and ionization, so that the gas is activated. Consequently, inert gas can be discharged by the NEG alloy films 29. Meanwhile, noble gas such as argon cannot be discharged by NEG alloys. In the ion pump in accordance with the present invention, noble gas that has been ionized is discharged by being embedded into the NEG constituents 12 or the inside of the flat-plate cathodes 2. There is a possibility that noble gas embedded in the NEG constituents 12 may be emitted again when the NEG constituents 12 are sputtered. Thus, the flat-plate cathodes 2 are the portions where noble gas is mainly discharged.

NEG alloys have characteristics in that the alloys can easily diffuse hydrogen therein. Therefore, the NEG alloy films 29 have a high hydrogen pumping capacity unless the surfaces of the NEG alloy films 29 are covered with gas other than hydrogen. In addition, NEG alloys can store a large quantity of hydrogen therein. Therefore, NEG alloys have a high hydrogen pumping capacity, and can maintain a high hydrogen pumping ability even when a large quantity of hydrogen is adsorbed onto the NEG alloys. The equilibrium vapor pressure of hydrogen at room temperature is as low as $1 \times 10^{-8}$ Pa. Thus, hydrogen that has been once diffused in the NEG alloy films 29 will not be emitted again. As the main residual gas in an ultra-high vacuum is hydrogen, using the ion pump of the present invention can effectively discharge hydrogen and reduce pressure, and thus can obtain an ultra-high vacuum.

A typical NEG alloy loses its pumping ability when the surface of the alloy is covered with gas other than hydrogen. Therefore, it is necessary to periodically perform activation to diffuse the gas on the surface to the inside and thus obtain a clean surface. In contrast, the ion pump of the present invention can continuously form new NEG alloy films while the ion pump is operating by continuously ionizing the residual gas and sputtering the NEG constituents. Consequently, it is possible to maintain a clean surface while the ion pump is operating, and eliminate the need to perform activation.

In the ion pump of the present invention, as the NEG constituents 12 are arranged in each cylindrical cell 23, ions uniformly impinge on the entire side faces of the NEG constituents 12 independently of the pressure in the pump, thus sputtering the NEG constituents 12. Consequently, even in an ultra-high vacuum or an extreme high vacuum, the ratio of the sputtered NEG materials remain unchanged, and the NEG alloy films 29 with an optimal composition ratio can thus be generated. Consequently, a high pumping speed is achieved independently of the pressure. In contrast, in the conventional ion pumps, the way of electric discharge differs depending on the pressure in the pump, and in an ultra-high vacuum or an extreme high vacuum, ions impinge on a portion on the surface of a flat-plate cathode corresponding to the central axis of a cylindrical cell in a concentrated manner. Therefore, the sputtered portion is localized at that portion. For such reasons, the ion pump of the present invention can solve the conventional problems.

In the ion pump of the present invention, the distance between the NEG constituents 12 and each cylindrical cell 23 is constant independently of the place. Further, the NEG constituents 12 are repeatedly stacked. Consequently, there is no possibility that the composition ratio of the resulting NEG alloy films 29 will be non-uniform depending on the place. Therefore, as a uniform, optimal composition ratio can be achieved in a wide range, the pumping speed can be increased. Although configurations other than the configuration in which the NEG constituents 12 are repeatedly stacked will be described in the following embodiments, it is preferable that the distance between the NEG constituents 12 and each cylindrical cell 23 be constant independently of the place, and the composition ratio of the NEG alloy films 29 be uniform.

From the operation principle described above, the ion pump of the present invention can effectively discharge the residual gas in a vacuum and can obtain an extreme high vacuum even when the ion pump is used alone. Further, as it is not necessary to periodically perform activation, the maintainability is improved. Further, as NEG alloys with an optimal composition ratio can be formed in a wide range independently of the pressure, a high pumping speed can be achieved at any pressure.

The ion pump of the present invention can, when operated mainly in a relatively high degree of vacuum of less than or equal to $10^{-4}$ Pa, form a high-purity NEG alloy that contains less impurities, such as oxygen, carbon, or water, than common NEG alloys. Consequently, the adsorption coefficient of the NEG alloy can be increased, and the pumping speed can thus be increased.

In the zirconium-vanadium-iron NEG alloy shown in Embodiment 1, an optimal weight composition ratio that can achieve the maximum pumping speed is: 70% zirconium, 25% vanadium, and 5% iron. As the NEG constituents 12 have a cylindrical structure, adjusting the height of each cylinder can adjust the sputtered amount of each material, and can generate the NEG alloy films 29 with an optimal composition ratio. For example, when the height of the cylinder of the zirconium 12A, that of the vanadium 12B, and that of the iron 12C shown in FIG. 2 are set to 7.0 mm, 2.5 mm, and 0.5 mm, respectively, a superior composition ratio can be achieved.

In order to obtain a high pumping speed, the NEG alloy films 29 should be generated uniformly and at an optimal composition ratio in a large area. Herein, it is also possible to reduce the height of each of the NEG components 12A, 12B, and 12C to shorten the period. Consequently, uniform films with a uniform composition can be generated. For example, when the height of the cylinder of the zirconium 12A, that of the vanadium 12B, and that of the iron 12C shown in FIG. 2 are set to 0.70 mm, 0.25 mm, and 0.05 mm, respectively, films with a uniform composition can be formed on the inner wall of the cylindrical cell 23 and the surfaces of the flat-plate cathodes 2. The size of each of the NEG constituents 12 is preferably determined taking into consideration the sputtering rate of each metal and the cost effectiveness of metal working.

Of the NEG constituents 12, the iron 12C is a magnetic material. Thus, it may disturb the magnetic field applied to the pump. Thus, instead of the iron 12C, it is also possible to use a non-magnetic material containing iron, for example, stainless steel. Accordingly, the influence on the magnetic field applied to the pump is eliminated, and the desired NEG alloy films 29 can be generated. In addition, expensive materials such as vanadium can be replaced with inexpensive materials such as a vanadium-iron alloy, a titanium-vanadium alloy, or vanadium oxide. Even when such materials are used, the desired NEG alloys can be generated by changing the size of each portion of the NEG constituents 12 as appropriate. As described above, as the materials used for the NEG constituents 12, not only pure metals, but also a variety of materials, such as alloys and ceramics, can be used.

Although Embodiment 1 shows the zirconium 12A, the vanadium 12B, and the iron 12C as examples of the NEG constituents 12, it is also possible to generate NEG alloy films by using other materials. In addition, the materials used for the NEG constituents 12 are not limited to three types, and may also be two types or four types. Examples include a NEG alloy that uses zirconium and aluminum, a NEG alloy that uses titanium, zirconium, and vanadium, a NEG alloy that uses yttrium, manganese, and aluminum, and a NEG alloy that uses titanium, zirconium, vanadium, and hafnium. Even when such NEG alloys are used, it is possible to generate NEG alloy films with an optimal composition ratio by appropriately designing the sizes of the NEG constituents 12.

The pumping speed for each gas differs depending on the type of a NEG alloy. Thus, the NEG alloy films 29 are changed by changing the materials of the NEG constituents 12 in accordance with the intended gas to be discharged. When the hydrogen pumping speed is increased to obtain an extreme high vacuum, zirconium, which has a high hydrogen storage capacity, has a low equilibrium vapor pressure, and is relatively inexpensive, is used as a base material, and iron, nickel, cobalt, aluminum, or the like, which promotes hydrogen dissociation reactions, is used in combination. For example, when a zirconium-aluminum alloy is generated, zirconium and aluminum are used for the NEG constituents 12A and 12B shown in FIG. 2, respectively, and structural units of the combination of the two metals are repeatedly stacked. As another example, when carbon monoxide is to be mainly discharged, a titanium-zirconium-vanadium alloy is used. In such a case, titanium, zirconium, and vanadium are used for the NEG constituents 12A, 12B, and 12C shown in FIG. 2, respectively, and structural units of the combinations of the three metals are repeatedly stacked.

In the ion pump of the present invention, it is also possible to easily form a plurality of different types of NEG alloy films 29 in the pump. For example, when different materials are used for the NEG constituents 12 of each cylindrical cell 23, it is possible to generate a different NEG alloy film 29 in each cylindrical cell 23. Consequently, the pumping speed for each type of gas can be freely designed, and the composition ratio of the residual gas in a vacuum can be set to a desired ratio. In addition, the cylindrical cell 23 that has no support bar 10 or the NEG constituents 12 can also be provided. In such a case, the conventional cylindrical cell that performs Penning discharge can also be provided in the pump.

In the conventional NEG pump, evacuation is performed after obtaining a clean surface by once subjecting the pump to the air, connecting the pump to a vacuum device, and performing activation. Therefore, there are restrictions such that a NEG pump that needs activation at a high temperature of greater than or equal to 700° C. can be used only for a limited device, or cannot be used. In contrast, the ion pump of the present invention can generate clean NEG alloys within a device that has been already evacuated to a vacuum. Therefore, it is not necessary to activate NEG alloys, and even NEG alloys that need activation at a high temperature of greater than or equal to 700° C. can be used for the device without restrictions, and thus, the use application can be expanded.

If materials with high hydrogen solubility (i.e., ability to dissolve hydrogen in the materials), such as titanium, zirconium, scandium, vanadium, yttrium, lanthanum, hafnium, tantalum, or alloys containing them are used as the NEG constituents 12, the hydrogen pumping capacity can be enhanced. When hydrogen that remains in a vacuum is ionized by electrons, such hydrogen ions are accelerated in an electric field, and collide with the NEG constituents 12. At this time, if the NEG constituents 12 with which the hydrogen ions have collided are materials with high hydrogen solubility, and the surfaces of the NEG constituents 12 have become clean by sputtering, some of the hydrogen ions are taken into the materials, and are then diffused in and stored in the materials. Consequently, as hydrogen is discharged not only by the NEG alloy films 29, the hydrogen pumping speed increases.

Hydrogen ions can also impinge on the flat-plate cathodes 2, the side walls 5, and the container 14. Thus, if materials with high hydrogen solubility, for example, titanium is used for the materials of the flat-plate cathodes 2, the side walls 5, and the container 14, the hydrogen pumping speed increases. Meanwhile, if materials with high hydrogen solubility, for example, titanium is used for the anode 1 and the flat-plate cathodes 2, hydrogen adsorbed onto the NEG alloy films 29 are diffused to the inside of the anode 1 and the flat-plate cathodes 2. Consequently, the hydrogen pumping capacity is enhanced. As described above, the material of each part of the ion pump of the present invention is preferably determined taking into consideration the specifications and the cost effectiveness.

Next, the influence of a magnetic field applied to the ion pump of the present invention, the voltage level, and the shape of each part on the pump performance will be described with reference to FIG. 6A. In the process in which the electron 24 ionizes the residual gas 27, if the applied magnetic field is reduced, the radius of the trochoidal trajectory 25 becomes large. Thus, the probability that the electron 24 will impinge on the cylindrical cell 23 and thus disappear increases. Meanwhile, if the magnetic field is increased, the radius of the trochoidal trajectory becomes small, and the electron range becomes short. Thus, the probability that the electron will collide with the residual gas decreases. From such principles, there is an optimal radius of the trochoidal trajectory at which the ionization efficiency becomes maximum. When a magnetic field is applied to realize such a radius, a high pumping speed is obtained.

Meanwhile, a scattering cross-section of when the electron 24 ionizes the residual gas 27 is maximum when the electron energy is from about 100 eV to 200 eV independently of the ion species of the residual gas 27. If the electric field is increased by increasing the voltage applied to the anode 1, electrons can be accelerated to the energy level at a shorter distance, and the ionization efficiency can thus be increased. Meanwhile, if the electron energy becomes higher, the radius of the trochoidal trajectory also becomes larger. Thus, the applied magnetic field is increased with an increase in the applied voltage so that the radius of the trochoidal trajectory becomes optimal.

In FIG. 5, electromagnets (which are made of coils, for example) may be used instead of the magnets 20. Alternatively, the magnets 20 and electromagnets may be used in combination. Changing the applied magnetic field and the electric field in accordance with the pressure in the pump can maintain an optimal radius of the trochoidal trajectory and achieve a high pumping speed in any pressure region.

With respect to the size of each cylindrical cell 23, as the diameter as well as the length in the axial direction is increased, the number of electrons that can be contained in the cell increases. In particular, when the pressure is lower, the number of electrons decreases, and electric discharge is thus difficult to maintain. Thus, increasing the size of each cylindrical cell 23 can maintain electric discharge and maintain the pumping speed. There is another advantage in that even when the pressure is low, pumping starts immediately after a voltage is applied. Meanwhile, as shown in FIG. 3, when the size of each cylindrical cell 23 is increased, the number of cylindrical cells 23 that can be arranged in the container 14 decreases, and thus, the pumping speed of the entire pump decreases. Further, the electric field intensity between each cylindrical cell 23 and the NEG constituents 12 becomes weak. Accordingly, the size of each cylindrical cell 23 and the voltage applied are adequately designed so as to maximize the pumping speed of the entire pump. It should be noted that the sizes of all cylindrical cells 23 need not be identical. For example, cylindrical cells 23 with a plurality of radii and lengths may be arranged in the container 14. Then, as long as electric discharge lasts in a single cylindrical cell 23, it becomes easier to start electric discharge in the neighboring cylindrical cells 23. Thus, cylindrical cells 23 with a relative large diameter are arranged discretely, for example. The diameter of each cylindrical cell 23 is typically about 10 mm to 200 mm, and the length thereof is typically about 10 mm to 200 mm. The shape of each cylindrical cell 23 is not limited to a cylinder, and may also be a triangle, a quadrangle, a hexagon, a star, or other types of cylinders.

In FIG. 6C, as the surface roughness of the inner surface of the cylindrical cell 23 is made rougher, the surface area of the NEG alloy film 29 deposited thereon increases, which in turn can increase the pumping speed. If there is contamination, such as an oxide film or an organic substance, on each of the surfaces of the cylindrical cell 23 and the flat-plate cathodes 2, the NEG alloy films 29 will fall off. Thus, such surfaces are sufficiently cleaned before assembly. In addition, during baking of the pump, a negative high voltage or a high alternating voltage is applied to the cylindrical cell 23, so that the surface of the cylindrical cell 23 is sputtered and cleaned, and the adhesion of the NEG alloy films 29 is thus increased. When an alternating voltage is applied, the NEG constituents 12 are also sputtered, so that contamination on the surface can be removed. Consequently, it becomes difficult for impurities to be mixed into the NEG alloy films 29 generated thereafter.

In FIG. 6A, as the outside diameters of the NEG constituents 12 are reduced, the space in the cylindrical cell 23 increases, so that the number of electrons that can be contained in the cell increases. However, as the NEG constituents 12 become thinner, the NEG constituents 12 are cut away by sputtering fast and thus have a short life. The outside diameters of the NEG constituents 12 may also be changed from place to place. For example, when the outside diameters of the NEG constituents 12 at positions near the flat-plate cathodes 2 are reduced, it becomes possible to make a distribution of an electric field on the side face of the cathode bar 3 more uniform. The outside diameter of the NEG constituents 12 is typically about 3 mm to 50 mm.

In the ion pump of the present invention, the cathode bar 3 and the flat-plate cathodes 2 are set at the same potential. However, an insulator may be provided therebetween to set them at different potentials. When the cathode bar 3 is set at a lower potential than the flat-plate cathodes 2, more residual gas ions move toward the cathode bar 3 than to the flat-plate cathodes 2. Thus, the cathode bar 3 is sputtered relatively more than the flat-plate cathodes 2. Consequently, the NEG alloy films 29 formed on the surfaces of the flat-plate cathodes 2 are not sputtered much. Thus, the flat-plate cathodes 2 can mainly serve to discharge gas using the NEG alloy films 29 deposited on the surfaces thereof. Further, the possibility that noble gas embedded in the flat-plate cathodes 2 may be emitted again by sputtering becomes further low.

When an insulating material is used for the side walls 5 to electrically insulate the flat-plate cathodes 2 from the container 14, it becomes possible to electrically connect the two flat-plate cathodes 2 only with the cathode bars 3. At this time, if a potential difference is provided between the two flat-plate cathodes 2, it is possible to flow current to each cathode bar 3 and heat it with the Joule heat. When the temperature of the cathode bar 3 is increased, the sputtering rate of the NEG constituents 12 increases, and the amount of generation of the NEG alloy films 29 thus increases. Consequently, the pumping speed can be increased.

Figure 8:
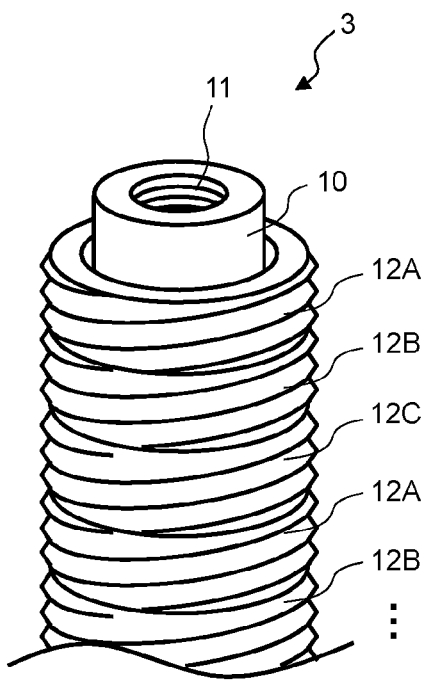
FIG. 8 is a perspective view of a cathode bar 3 obtained by providing a thread on the side face of NEG constituents 12.

FIG. 8 is a perspective view of the cathode bar 3 obtained by providing a thread on the side face of the NEG constituents 12. As more corners are provided on the NEG constituents 12, the probability that ions will impinge on the NEG constituents 12 obliquely increases, which in turn increases the sputtering rate. Consequently, it is possible to generate more NEG alloy films 29 and maintain the pumping speed even at a low pressure. When acute portions are formed by the thread, an electric field is concentrated at such portions, and electrons are thus emitted through field emission. Accordingly, the electrons are supplied into the cylindrical cell 23, and electric discharge can thus be maintained even at a low pressure. The shape of the NEG constituents 12 is not limited to a cylinder, and may also be a triangle, a quadrangle, a hexagon, a star, or other types of cylinders.

Figure 9:
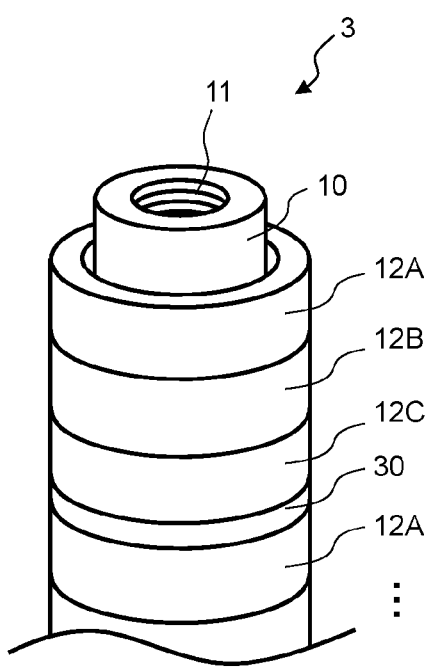
FIG. 9 is a perspective view of the cathode bar 3 with a cylindrical secondary electron emitting material 30.

FIG. 9 is a perspective view of the cathode bar 3 with a cylindrical secondary electron emitting material 30. The secondary electron emitting material 30 with a low work function, such as yttrium oxide, cesium hydroxide, barium oxide, zirconium dioxide, titanium oxide, or a material containing them, is arranged with the NEG constituents 12. When the ionized residual gas 27 collides with the secondary electron emitting material 30, a number of secondary electrons are emitted therefrom. Consequently, the electrons are supplied into the cylindrical cell 23, and electric discharge can thus be maintained even at a low pressure. If the constituent element of the secondary electron emitting material 30 is not necessary for the composition of the NEG alloy films 29, a material with a low sputtering rate is selected for the secondary electron emitting material 30. In such a case, the height of the cylindrical structure of the secondary electron emitting material 30 is set smaller than the heights of the other NEG constituents 12 so as to reduce the amount of the secondary electron emitting material 30 that is mixed in the NEG alloy films 29. The secondary electron emitting material may also be used for the materials of the flat-plate cathodes 2, the side walls 5, and the container 14. In such a case, also, the number of secondary electrons that are emitted in ion collision can be similarly increased. In addition, the secondary electron emitting material may also be used for the cylindrical cell 23. In such a case, the number of secondary electrons that are emitted when electrons collide with the cylindrical cell 23 can be increased Instead of, or in addition to the secondary electron emitting material 30, it is also possible to add a cylindrical structure of a catalyst material that promotes dissociation reactions of hydrogen molecules, such as palladium, iron, cobalt, nickel, aluminum, or an alloy containing them. When such materials deposit on the surfaces of the NEG alloy films 29, surface reactions where hydrogen molecules dissociate into atoms is promoted, so that the amount of hydrogen that is absorbed into the NEG alloy films 29 is increased. Consequently, the hydrogen pumping speed increases.

In Embodiment 1, the NEG constituents 12 have a cylindrical structure. Such a configuration is advantageous in that changing the material of each cylinder can easily change the NEG alloy films 29 to be generated. In addition, changing the height or the diameter of each cylinder can change the sputtering rate or the electric field intensity at any position. Further, surface processing can be performed by, for example, providing each cylinder with a screw, or the secondary electron emitting material 30 or a catalyst material may also be added to the gap between the cylinders.

When the ion pump of the present invention is attached to a cold-cathode field-emission electron gun mounted on a charged particle beam device, such as a scanning electron microscope, a transmission electron microscope, or a scanning transmission electron microscope, it is possible to increase the stability of an electron beam, the amount of current, the luminance, and the like. In addition, the ion pump of the present invention may also be attached to other vacuum devices, such as a film-deposition device or an etching device, whereby a high-quality device that contains less mixtures can be produced.

Embodiment 2

Embodiment 2 will describe a configuration example of the cathode bar 3 different from that in Embodiment 1. As the other configurations are the same as those in Embodiment 1, the configuration of the cathode bar 3 will be mainly described below.

Figure 10:
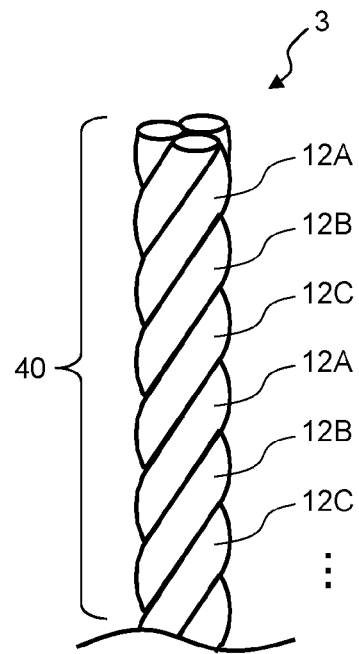
FIG. 10 is a perspective view showing a configuration example of the cathode bar 3 in Embodiment 2.

FIG. 10 is a perspective view showing a configuration example of the cathode bar 3 in Embodiment 2. In the configuration example shown in FIG. 10, the cathode bar 3 is formed of a strand cathode 40 obtained by twisting linear NEG constituents 12. The materials of the NEG constituents 12 are the same as those in Embodiment 1. The opposite ends of the strand cathode 40 are fixed to the respective flat-plate cathodes 2, and the strand cathode 40 is arranged along the central axis of the cylindrical cell 23. When the strand cathode 40 is sputtered by ions of the residual gas 27, atoms of each of the linear NEG constituents 12 deposit on the inner wall of the cylindrical cell 23 and the surfaces of the flat-plate cathodes 2, so that the NEG alloy films 29 of zirconium-vanadium-iron and the like are generated. The other configurations, operation principle, and variation are the same as those in Embodiment 1.

When the strand cathode 40 is used, the structure of the cathode bar 3 becomes simple, which is advantageous in that the production cost for processing and the like can be reduced. When the diameter of each linear material of the NEG constituents 12 is reduced, the repetition period of each material of the NEG alloy becomes shorter, so that the NEG alloy films 29 with a uniform composition ratio can be generated. When the ratio of the diameters of the respective linear materials is changed, the number of atoms that are emitted during spurring will change, so that the NEG alloy films 29 with the desired composition ratio can be generated. The cross-sectional shape of each linear material is not limited to a circle, and may also be a triangle, a quadrangle, a hexagon, a star, or other types of cylinders. Further, a thread may also be provided. When ions impinge on the NEG constituents 12 obliquely, the sputtering rate increases. In addition, electrons are supplied through field emission. It is also possible to provide other linear materials, such as the secondary electron emitting material 30 or a catalyst for dissociating hydrogen, in the strand cathode 40.

Figure 11:
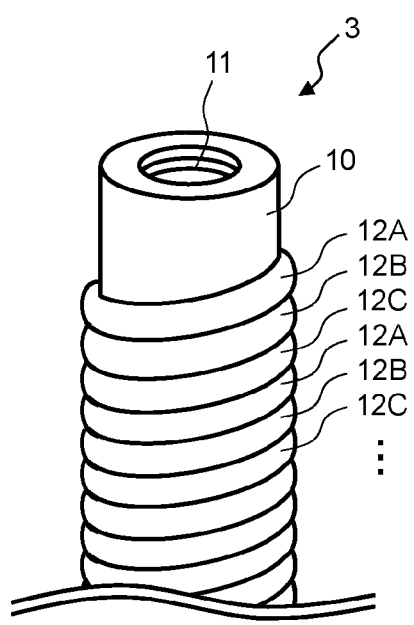
FIG. 11 is a perspective view showing another configuration example of the cathode bar 3 in Embodiment 2.

FIG. 11 is a perspective view showing another configuration example of the cathode bar 3 in Embodiment 2. In this configuration example, a plurality of independent linear NEG constituents 12 are wound around the support bar 10. The materials of the NEG constituents 12 are the same as those in Embodiment 1. In the configuration shown in FIG. 11, there is no danger that the cathode will bend as the rigid support bar 10 is provided. In addition, as the NEG constituents 12 are linear materials, the production cost is reduced. The ion pump of the present invention is advantageous when it is attached to a device to be evacuated and is driven for a long period of time, for example, for decades. When the support bar 10 is provided as in the configuration of FIG. 11, the possibility that the strand cathode 40 will bend due to a plurality of baking processes or a sputtering process for a long time is reduced as compared with the configuration of FIG. 10. That is, the possibility of abnormal electric discharge, which may otherwise occur if the distance between the cylindrical cell 23 and the strand cathode 40 becomes short, is reduced. Further, as the distance between the cylindrical cell 23 and the strand cathode 40 becomes more constant independently of the place, the composition and the thickness of the NEG alloy films 29 become uniform, and the pumping speed can be increased.

Figure 12:
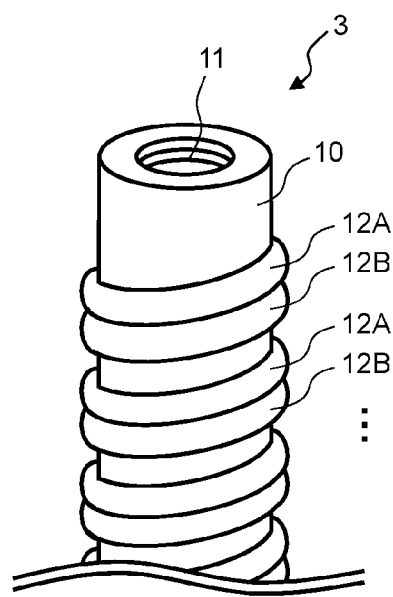
FIG. 12 is a perspective view showing a still another configuration example of the cathode bar 3 in Embodiment 2.

FIG. 12 is a perspective view showing a still another configuration example of the cathode bar 3 in Embodiment 2. In the configuration example shown in FIG. 12, a gap is provided between the NEG constituents 12 wound around the support bar 10 so that ions of the residual gas are also allowed to impinge on the support bar 10. For example, when zirconium is used for the NEG constituent 12A, vanadium is used for the NEG constituent 12B, and stainless steel is used for the material of the support bar 10, such materials are sputtered and the constituent atoms are thus emitted, so that the zirconium-vanadium-iron NEG alloy films 29 can be generated. In such a configuration, the number of the linear NEG constituents 12 that are used can be reduced, and the production cost can thus be reduced. Adjusting the height of the gap between the NEG constituents 12 can adjust the number of atoms that are emitted when the support bar 10 is sputtered. Consequently, the composition ratio of the NEG alloy films 29 can be optimized. Further, when a material with high hydrogen solubility, such as titanium or zirconium, is used as the material of the support bar 10, an action where hydrogen is diffused in the support bar 10 occurs, so that the hydrogen pumping speed can be increased.

In Embodiment 2, linear materials are used as the NEG constituents 12. Such a configuration is advantageous in that the structure of the pump can be simple and the assembly becomes easy. Further, there is another advantage in that the production cost is reduced.

Embodiment 3

Embodiment 3 of the present invention will describe configuration examples of an ion pump with an electron source. The other configurations are the same as those in Embodiments 1 to 2. Therefore, the configuration of the electron source will be mainly described hereinafter.

Figure 13:
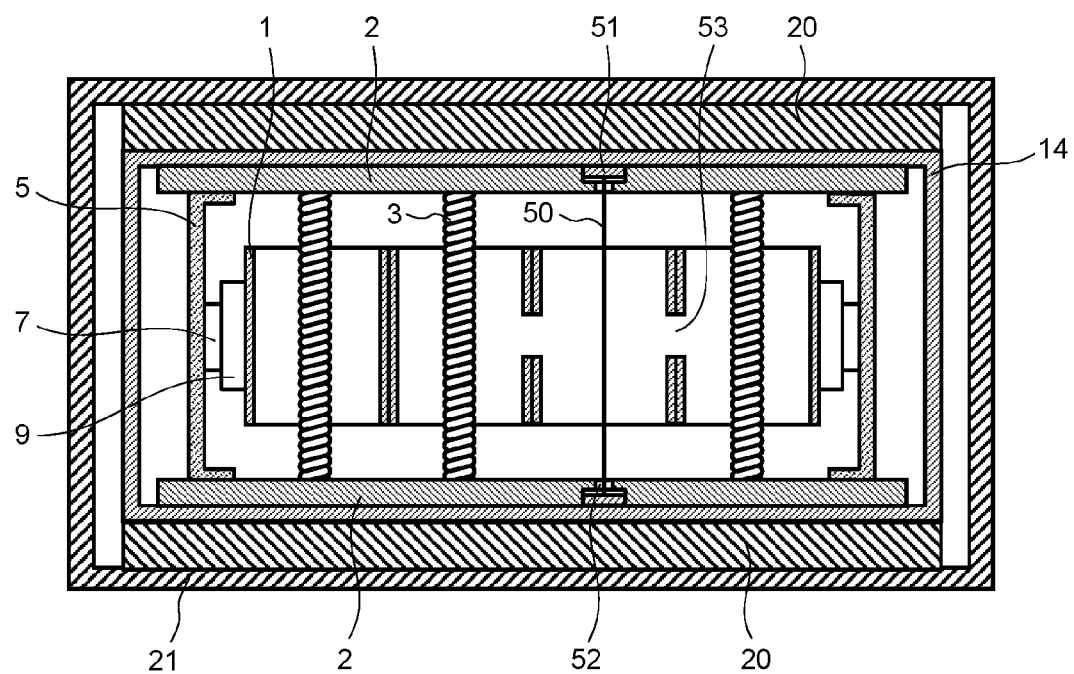
FIG. 13 is a side sectional view of the ion pump in accordance with Embodiment 3.

FIG. 13 is a side sectional view of the ion pump in accordance with Embodiment 3. As the cathode bar 3, the configuration shown in FIG. 11 is used as an example. In the configuration example shown in FIG. 13, some of the cathode bars 3 are removed, and a thermionic source 50 is provided in the cylindrical cell 23. As the material of the thermionic source 50, a material with a high melting point and a low sputtering rate, such as a tungsten filament, is used. The thermionic source 50 is arranged along the central axis of the cylindrical cell 23, and the opposite ends of the thermionic source 50 are fixed to the top and bottom flat-plate cathodes 2. The opposite ends of the thermionic source 50 are covered with insulating materials 51, such as insulators, so as to be electrically insulated from the flat-plate cathodes 2 and the container 14. In order to prevent the NEG alloy films 29 from depositing on the entire surfaces of the insulating materials 51, which would otherwise allow electrical conduction, openings 52 provided in the respective flat-plate cathodes 2 are made smaller than the insulating materials 51. The opposite ends of the thermionic source 50 are connected to the feed-through 17 with wires (not shown) so as to be electrically conducted by an external voltage application unit (e.g., the voltage source 31). The thermionic source 50 is heated to a temperature of greater than or equal to 1500° C. so that thermoelectrons are emitted. The amount of the thermoelectrons is about 1 μA to 10 mA, and the temperature of the thermionic source 50 is adjusted to control the amount of emission. The thermoelectrons have an energy of several eV when emitted.

The side faces of the cylindrical cell 23 in which the thermionic source 50 is provided and the neighboring cylindrical cells 23 are provided with side-face openings 53. Electrons emitted from the thermionic source 50 pass through the side-face openings 53, and are supplied into the neighboring cylindrical cells 23. In addition, electrons that have collided with the cylindrical cell 23 or the flat-plate cathodes 2 further emit secondary electrons, which are also supplied to the neighboring cylindrical cells 23.

The electrons that are supplied into the neighboring cylindrical cells 23 undergo trochoidal motion, and ionize the residual gas, and further supply electrons. Consequently, the generation of the NEG alloy films 29 is promoted in the cylindrical cells 23, and the pumping speed can thus be increased. Using such a configuration can compensate for a reduction in the number of electrons at a low pressure and maintain a high pumping speed.

It is also considered to supply electrons by arranging the thermionic source 50 outside the cylindrical cell 23. In such a case, however, the supplied electrons are accelerated by an electric field, and have an energy as high as several keV when entering the cylindrical cell 23. Therefore, the radius of the trochoidal trajectory becomes large, and thus the electrons will easily collide with the cylindrical cell 23. That is, even when electrons are supplied, such electrons will disappear soon. Thus, the effect of increasing the pumping speed is low. Meanwhile, when the thermionic source 50 is provided in the cylindrical cell 23 as in the configuration shown in FIG. 13, it is possible to supply electrons with low energy into the cylindrical cell 23. Such electrons undergo trochoidal motion with an optimal radius, and are trapped within the cylindrical cell 23 for a long period of time, which significantly promotes ionization of the residual gas, and thus can increase the pumping speed.

When the thermionic source 50 is heated to a high temperature, the thermionic source 50 may deform. In the configuration example shown in FIG. 13, the opposite ends of the thermionic source 50 are fixed to the top and bottom flat-plate cathodes 2, so that the thermionic source 50 is prevented from touching the cylindrical cell 23, which would otherwise cause short. In addition, such a fixation method can precisely arrange the thermionic source 50 along the central axis of the cylindrical cell 23. Thus, as the emitted electrons undergo axisymmetric trochoidal motion, the efficiency of supplying electrons to the surrounding is increased.

It is also possible to directly fix the thermionic source 50 at one end to the flat-plate cathode 2 without using the insulating material 51. In such a case, the structure becomes simple, and the production cost is reduced. Meanwhile, it is also possible to, for the thermionic source 50 that are electrically insulated at both ends by the insulating materials 51, set the potential of the thermionic source 50 at a different level from the potentials of the flat-plate cathodes 2 and the cathode bar 3 by using an external power supply. When the potential of the thermionic source 50 is set higher or lower than the potentials of the flat-plate cathodes 2 and the cathode bar 3, the electric field intensity between the thermionic source 50 and the cylindrical cell 23 will change. Consequently, the radius of the trochoidal trajectory of the emitted electrons can be changed, and the radius can be optimized so as to increase the pumping speed.

Figure 14:
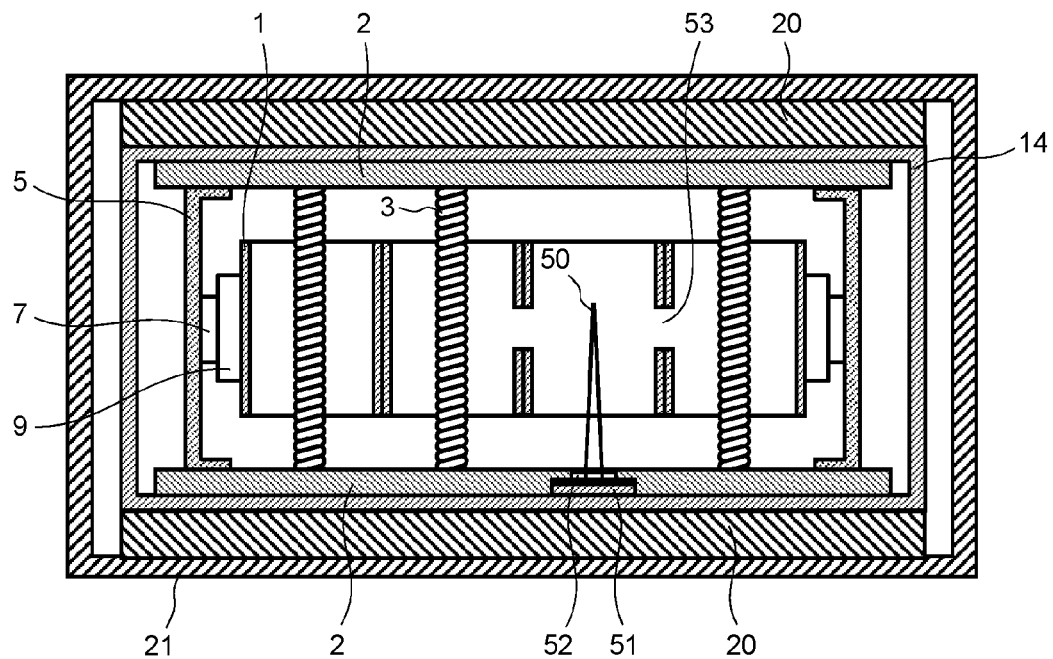
FIG. 14 is a side sectional view showing another configuration example of the ion pump in accordance with Embodiment 3.

FIG. 14 is a side sectional view showing another configuration example of the ion pump in accordance with Embodiment 3. In the configuration example shown in FIG. 14, the thermionic source 50 is formed in a hairpin shape, and only one end thereof is fixed to the flat-plate cathode 2. When the fixation method shown in FIG. 14 is used, assembly becomes easy, and it becomes only necessary to form the insulating material 51 and the opening 52 on one side of the flat-plate cathode 2. Consequently, the production cost can be reduced.

The thermionic source 50 shown in each of FIGS. 13 and 14 has a configuration in which the thermionic source 50 is fixed at one/both end(s) to the flat-plate cathode(s) 2, and is inserted in the cylindrical cell 23. Therefore, it is also possible to provide a plurality of thermionic sources 50 and insert them in the cylindrical cell 23. Increasing the number of the thermionic sources 50 can increase the number of electrons supplied and the places for supplying electrons, and thus can increase the pumping speed.

Figure 15:
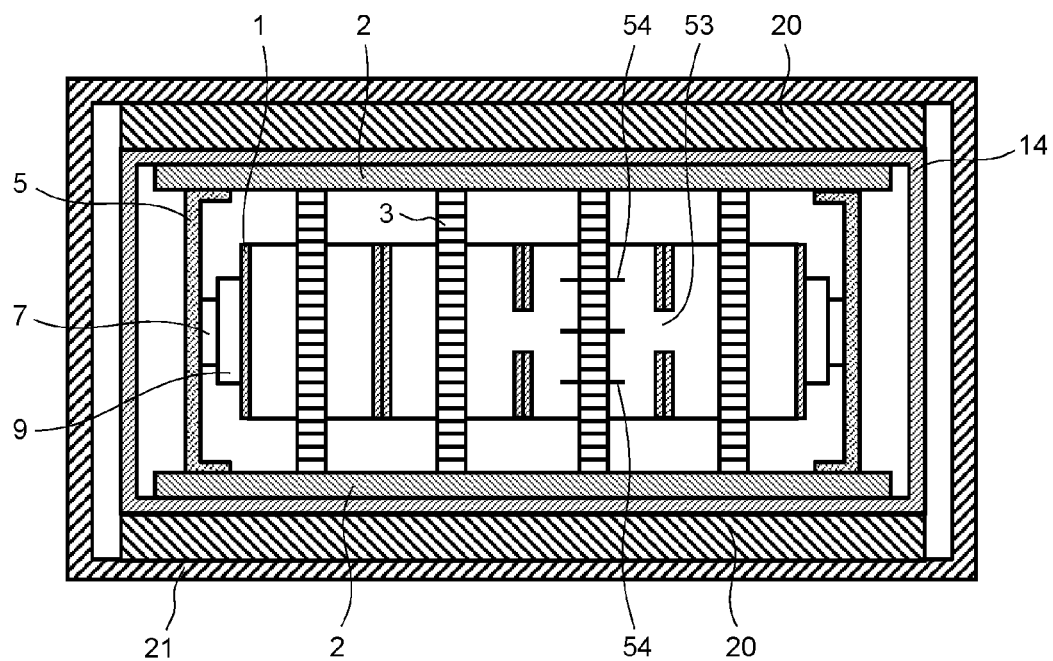
FIG. 15 is a side sectional view showing still another configuration example of the ion pump in accordance with Embodiment 3.

FIG. 15 is a side sectional view showing still another configuration example of the ion pump in accordance with Embodiment 3. In the configuration example shown in FIG. 15, a field-emission electron source 54 is provided on the surface of the cathode bar 3. The field-emission electron source 54 is, for example, a thin wire of tungsten whose tip end has been sharpened to a size of less than or equal to 100 μm. The thin wire is arranged such that the sharpened tip end points to the inner wall of the cylindrical cell 23. The number of the field-emission electron sources 54 that are arranged in a single cylindrical cell 23 may be either one or more.

As an electric field is concentrated at the tip end of the field-emission electron source 54, electric discharge occurs due to the tunnel effect. The emitted electrons have an energy as low as several eV when emitted, and thus are trapped within the cylindrical cell 23 for a long period of time as with the thermoelectrons. The emitted electrons ionize the residual gas, and thus promote the generation of the NEG alloy films 29. When the field-emission electron source 54 is used, it becomes unnecessary to use an external power supply for heating the insulating materials 51, the openings 52, and the thermionic source 50. Thus, the production cost can be reduced. The amount of current that is discharged from the field-emission electron source 54 is controlled by the potential difference between the cylindrical cell 23 and the field-emission electron source 54 and the diameter of the tip end of the field-emission electron source 54.

Figure 16:
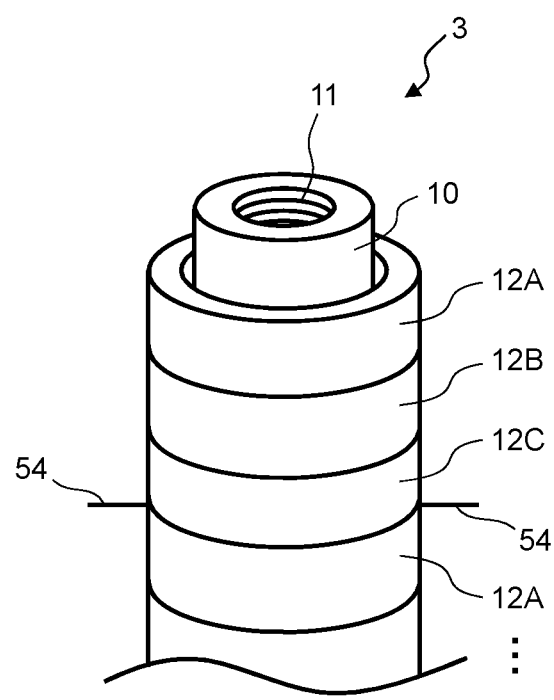
FIG. 16 is a perspective view of the cathode bar 3 with a field-emission electron source 54.

FIG. 16 is a perspective view of the cathode bar 3 with the field-emission electron source 54. The field-emission electron source 54 is fixed by being sandwiched between the stacked NEG constituents 12. Even when the linear NEG constituents 12 are used, it is possible to fix the field-emission electron source 54 by sandwiching the field-emission electron source 54 between the linear members. As other types of the field-emission electron source 54, whiskers, carbon nanotubes, and the like can also be used. The field-emission electron source 54 is fixed to the cathode bar 3, and is inserted into the cylindrical cell 23. Thus, it is possible to provide the plurality of cathode bars 3 with the field-emission electron sources 54 to increase the number of electrons supplied and the places for supplying electrons.

Figure 17:
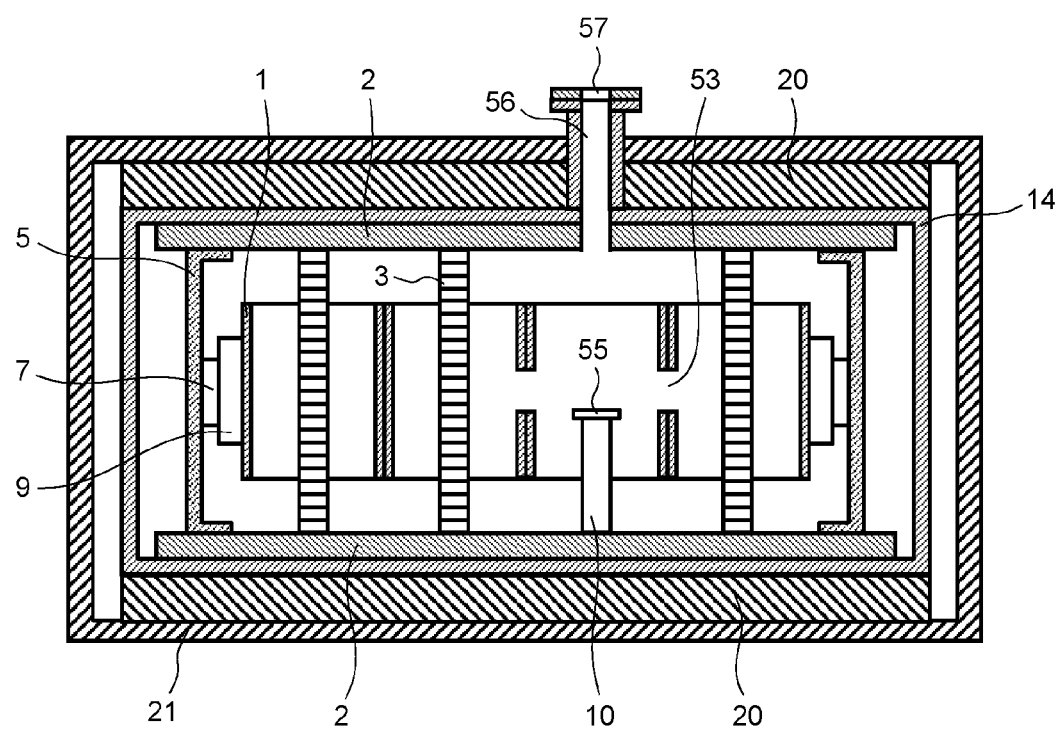
FIG. 17 is a side sectional view showing another configuration example of the ion pump in accordance with Embodiment 3.

FIG. 17 is a side sectional view showing another configuration example of the ion pump in accordance with Embodiment 3. In the configuration example shown in FIG. 17, some of the cathode bars 3 are removed, and a photoexcited electron source 55 with a low work function, such as cesium, is arranged in the cylindrical cell 23. The photoexcited electron source 55 is arranged by being fixed to the support bar 10. Alternatively, the support bar 10 itself or the outer periphery of the support bar 10 may be formed as the photoexcited electron source 55. An optical path 56 and a viewport 57 are provided in the container 14, the magnet 20, and the yoke 21 at positions corresponding to the photoexcited electron source 55.

The photoexcited electron source 55 is irradiated with a light beam from an external light source (not shown) via the viewport 57 and the optical path 56. Consequently, photoelectrons are emitted from the photoexcited electron source 55. Such photoelectrons are trapped within the cylindrical cell 23 for a long period of time, and ionize the residual gas, thus promoting the generation of the NEG alloy films 29. The photoexcited electron source 55 is fixed to the flat-plate cathode 2 via the support bar 10, and is inserted into the cylindrical cell 23. Thus, providing a plurality of photoexcited electron sources 55 can increase the number of electrons supplied and the places for supplying electrons. The amount of current that is discharged from the photoexcited electron source 55 is controlled by the light irradiation amount.

Embodiment 3 has showed examples of an ion pump with an electron source. Such a configuration is advantageous in that low-speed electrons can be added into the cylindrical cell 23 of the ion pump to promote ionization, and the pumping speed can thus be increased.

Embodiment 4

Embodiment 4 will describe configuration examples of an ion pump with a heater. The other configurations are the same as those in Embodiments 1 to 3. Thus, the configuration of the heater will be mainly described below.

Figure 18:
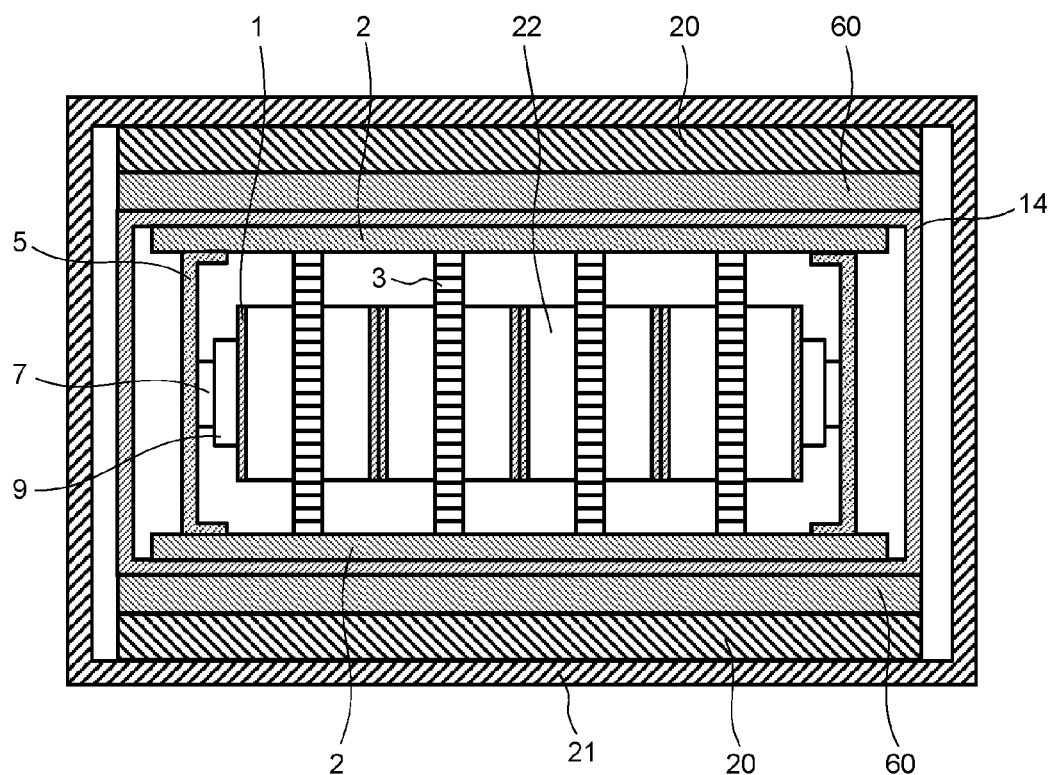
FIG. 18 is a side sectional view of the ion pump in accordance with Embodiment 4.

FIG. 18 is a side sectional view of the ion pump in accordance with Embodiment 4. In the configuration shown in FIG. 18, a heater 60 is provided between the container 14 and each magnet 20. When the degree of vacuum has increased to an extreme high vacuum, the sputtering rate of the cathode bar 3 decreases, and the amount of generation of the NEG alloy films 29 thus decreases. At this time, the heaters 60 are used to heat the anode 1 and the flat-plate cathodes 2, so that the gas adsorbed into the NEG alloy films 29 deposited thereon is diffused. Consequently, the cleanliness of the surfaces of the NEG alloy films 29 increases, which in turn increases the adsorption coefficient. Therefore, the pumping speed can be increased even under an extreme high vacuum. Further, as the temperatures of the anode 1 and the flat-plate cathodes 2 are increased, the adhesion of the NEG alloy films 29 increases.

In baking of the ion pump, heating may be performed with the heaters 60. Baking of the ion pump is performed at a relatively high pressure. Thus, the NEG alloy films 29 absorb much of the residual gas. At this time, if heating is performed with the heaters 60, the residual gas components in the NEG alloy films 29 are diffused, and the surface cleanness is thus increased. Consequently, the pumping speed increases, and the degree of vacuum increases immediately after the baking.

Usually, when a magnetic field application unit, such as the magnets 20, is heated to a high temperature, the magnetic property is lost. Thus, if the heaters 60 are arranged on the inner side than the magnets 20 and at positions in contact with the outside of the container 14, it is possible to efficiently heat the anode 1 and the flat-plate cathodes 2 via the container 14 without undesirably heating the magnets 20. In addition, the size of the device can be reduced, and the convenience is increased. When samarium cobalt with a relatively high heatresistant temperature and the like are used for the magnets 20, it becomes unnecessary to remove the magnets 20 even when the heaters 60 are operated.

Figure 19:
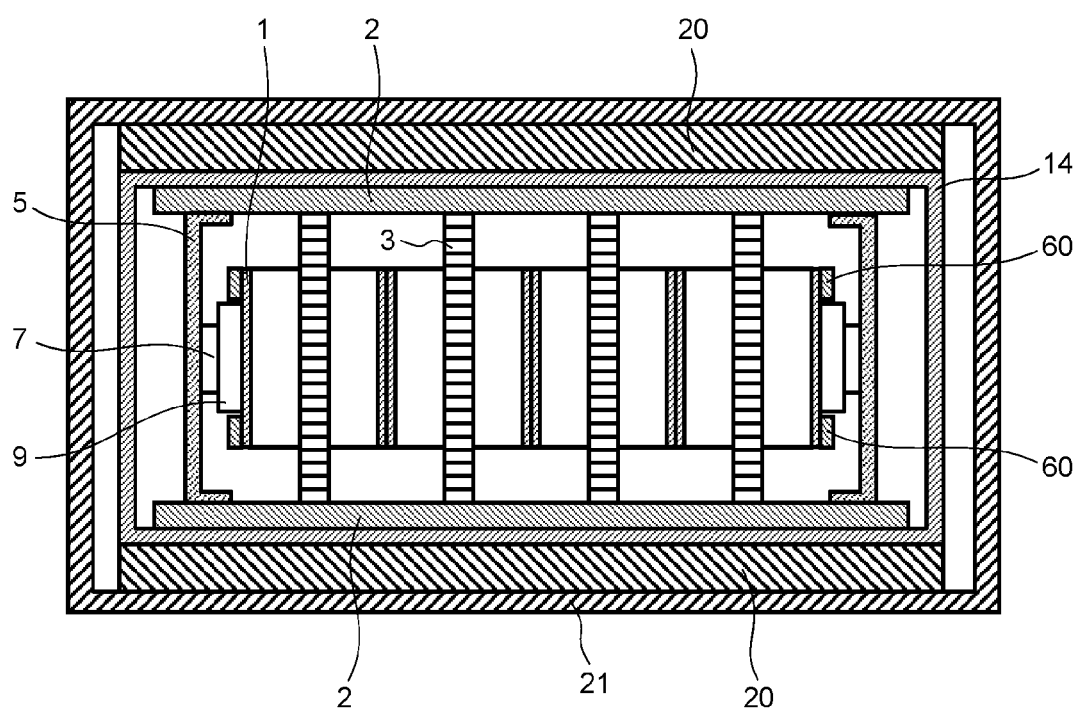
FIG. 19 is a side sectional view showing another configuration example of the ion pump in accordance with Embodiment 4.

FIG. 19 is a side sectional view showing another configuration example of the ion pump in accordance with Embodiment 4. The heaters 60 are arranged in a vacuum such that they are in contact with the anode 1 in the container 14. Thus, the anode 1 can be directly heated efficiently, and a temperature increase of the magnets 20 is suppressed. As the NEG alloy film 29 generated on the surface of the anode 1 is heated, diffusion of the adsorbed gas occurs. Thus, the pumping speed increases.

Figure 20:
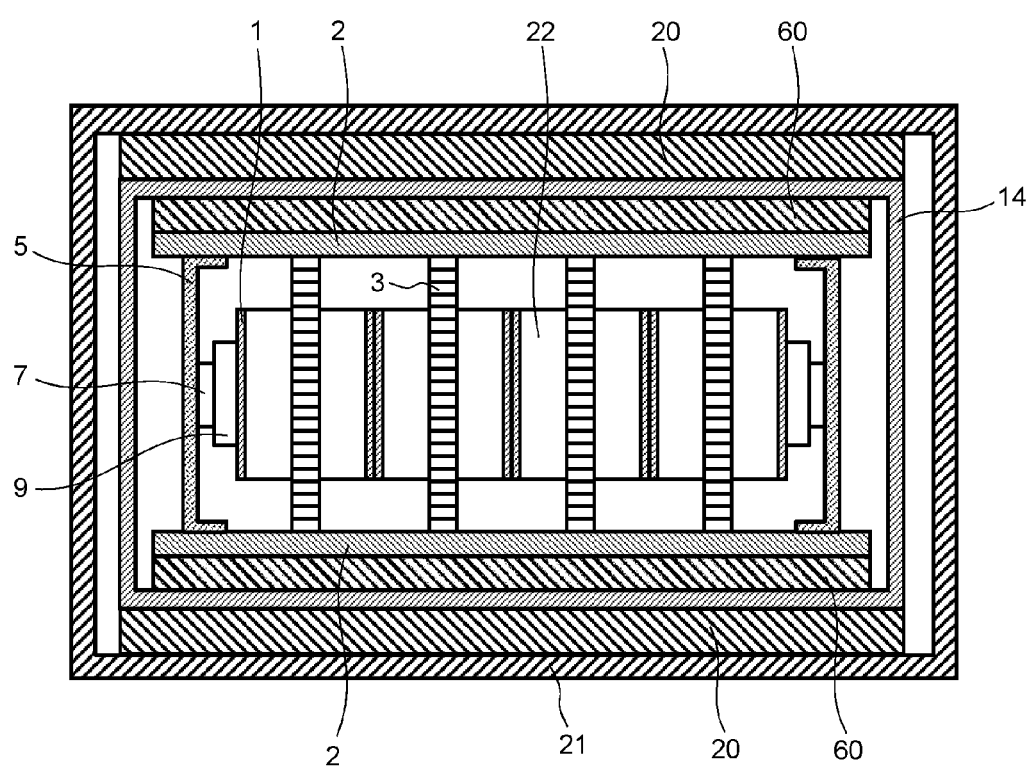
FIG. 20 is a side sectional view showing still another configuration example of the ion pump in accordance with Embodiment 4.

FIG. 20 is a side sectional view showing still another configuration example of the ion pump in accordance with Embodiment 4. The heaters 60 are arranged in a vacuum such that they are located in the container 14 and are in contact with the flat-plate cathodes 2. Thus, the flat-plate cathodes 2 can be efficiently heated, and a temperature increase of the magnets 20 is suppressed. As the NEG alloy films 29 generated on the surfaces of the flat-plate cathodes 2 are heated, diffusion of the adsorbed gas occurs. Thus, the pumping speed increases. As the heaters 60 are provided on the back faces of the flat-plate cathodes 2, assembly becomes easy, and the production cost is reduced.

Embodiment 4 have showed examples of an ion pump with a heater. Such a configuration is advantageous in that diffusion of the gas adsorbed into the NEG alloy films 29 is promoted, and the pumping speed can thus be increased.

<Variation of the Present Invention>

Figure 21:
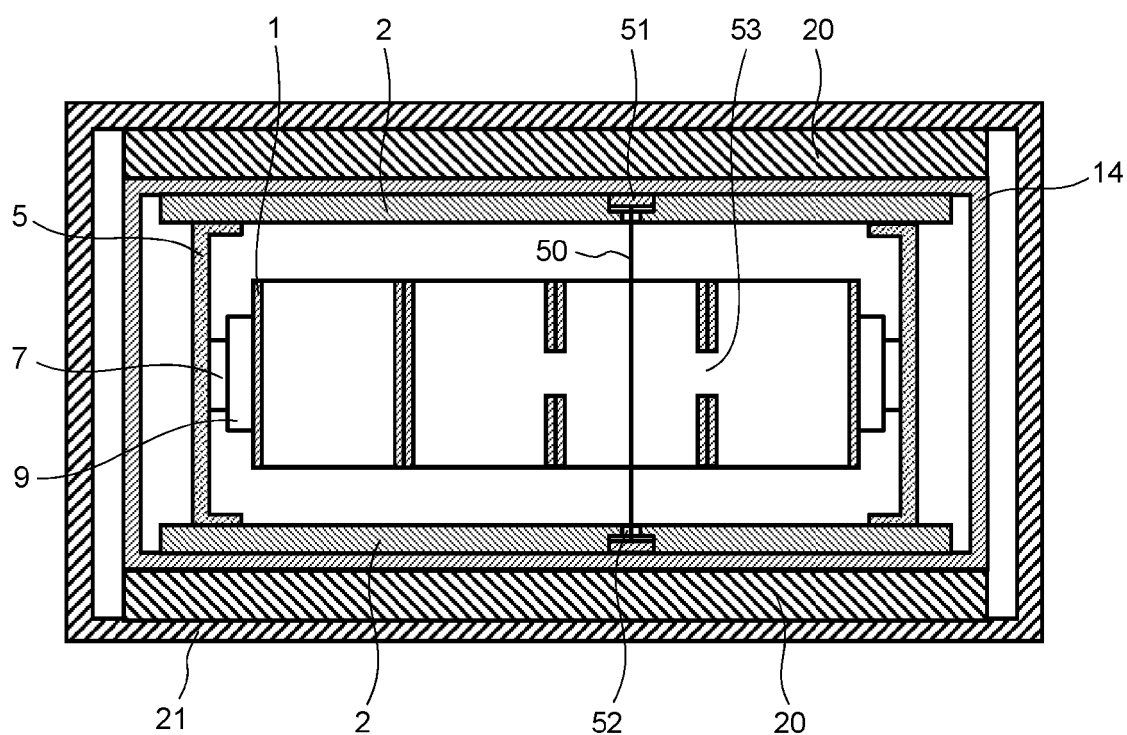
FIG. 21 is a view showing a variation in which an electron source is provided instead of the cathode bar 3.

FIG. 21 is a view showing a variation in which an electron source is provided instead of the cathode bar 3. Although the thermionic source 50 described with reference to FIG. 13 is shown as an example of the electron source herein, other electron sources described with reference to FIGS. 14 to 16 may also be used. Even in the configuration without the cathode bar 3, ionization of the residual gas is promoted by electrons supplied into the cylindrical cell 23 by the electron source. Thus, the pumping ability can be increased. In this configuration, a residual gas adsorption material, such as titanium, can be used as the material of the flat-plate cathodes 2. In such a case, the residual gas adsorption material on the surfaces of the flat-plate cathodes 2 is sputtered by the ionized residual gas.

It should be noted that the present invention is not limited to the aforementioned embodiments, and includes a variety of variations. For example, although the aforementioned embodiments have been described in detail to clearly illustrate the present invention, the present invention need not include all of the configurations described in the embodiments. It is possible to replace a part of a configuration of an embodiment with a configuration of another embodiment. In addition, it is also possible to add, to a configuration of an embodiment, a configuration of another embodiment. Further, it is also possible to, for a part of a configuration of each embodiment, add, remove, or substitute a configuration of another embodiment.

DESCRIPTION OF SYMBOLS

1 Anode
2 Flat-plate cathode
3 Cathode bar
4 Fastening hole
5 Side wall
6 Fastening hole
7 Insulator
8 Fastening hole
9 Shield
10 Support bar
11 Tapped hole
12 NEG constituents
13 Ion pump element
14 Container
15 Pipe
16 Flange
17 Feed-through
18 Wire
19 Magnetic field application unit
20 Magnet
21 Yoke
22 Electron cloud
23 Cylindrical cell
24 Electron
25 Trochoidal trajectory
26 Equipotential surface
27 Residual gas
28 Ion of the residual gas
29 NEG alloy film
30 Secondary electron emitting material
31 Voltage source
40 Strand cathode
50 Thermionic source
51 Insulating material
52 Opening
53 Side-face opening
54 Field-emission electron source
55 Photoexcited electron source
56 Optical path
57 Viewport
60 Heater

What is claimed is:
1. An ion pump comprising:
two opposite flat-plate cathodes;
an anode with a cylindrical shape having openings, the openings facing the respective flat-plate cathodes;
a voltage application unit configured to apply a potential higher than potentials of the flat-plate cathodes to the anode;
a magnetic field application unit configured to apply a magnetic field along an axial direction of the cylindrical shape of the anode; and
a cathode bar arranged within the anode,
wherein:
a surface of the cathode bar is formed with a material that forms a non-evaporative getter alloy film on the anode or the flat-plate cathodes,
the material that forms the non-evaporative getter alloy film includes a first-type material and a second-type material different from the first-type material, the first-type material forming the non-evaporative getter alloy film due to a sputtering action, and
structural units each having a first portion formed with the first-type material and a second portion formed with the second-type material are stacked along a drawing direction of the cathode bar.

2. The ion pump according to claim 1,
wherein:
the cathode bar includes a support bar having opposite ends that are fixed to the respective flat-plate cathodes, and
the first portion and the second portion are arranged around an outer periphery of the support bar.

3. The ion pump according to claim 2,
wherein:
a gap portion is formed between the first portion and the second portion.

4. The ion pump according to claim 3,
wherein:
the gap portion has disposed thereon a secondary electron emitting material that emits secondary electrons.

5. The ion pump according to claim 2,
wherein:
the first portion and the second portion are arranged around the outer periphery of the support bar by being wound around the support bar.

6. The ion pump according to claim 1,
wherein:
the cathode bar is formed by twisting the first-type material and the second-type material.

7. The ion pump according to claim 1, further comprising an electron source arranged in a cylindrical hollow portion of the anode.

8. The ion pump according to claim 7,
wherein:
a cylinder of the anode having the electron source has an opening in a side face of the cylinder of the anode having the electron source.

9. A charged particle beam device comprising:
a column that houses irradiation optics to irradiate a sample with a charged particle beam;
a sample chamber in which the sample is set; and
an ion pump connected to one of the column or the sample chamber,
wherein:
the ion pump includes
two opposite flat-plate cathodes,
an anode with a cylindrical shape having openings, the openings facing the respective flat-plate cathodes,
a voltage application unit configured to apply a potential higher than potentials of the flat-plate cathodes to the anode,
a magnetic field application unit configured to apply a magnetic field along an axial direction of the cylindrical shape of the anode, and
a cathode bar arranged within the anode, and
a surface of the cathode bar is formed with a material that forms a non-evaporative getter alloy film on the anode or the flat-plate cathodes,
a surface of the cathode bar has a first-type material and a second-type material different from the first-type material, the first-type material forming the non-evaporative getter alloy film due to a sputtering action, and
structural units each having a first portion formed with the first-type material and a second portion formed with the second-type material are stacked along a drawing direction of the cathode bar.

10. The charged particle beam device according to claim 9, wherein:
the cathode bar includes a support bar having opposite ends that are fixed to the respective flat-plate cathodes, and
the first portion and the second portion are arranged around an outer periphery of the support bar.

11. The charged particle beam device according to claim 10, wherein:
the first portion and the second portion are arranged around the outer periphery of the support bar by being wound around the support bar.

12. The charged particle beam device according to claim 9, wherein:
the cathode bar is formed by twisting the first-type material and the second-type material.

13. The charged particle beam device according to claim 9, wherein:
the ion pump further includes an electron source arranged in a cylindrical hollow portion of the anode.

* * * * *